US012606899B2

(12) United States Patent
Okamoto et al.

(10) Patent No.: US 12,606,899 B2
(45) Date of Patent: Apr. 21, 2026

(54) DEPOSITION MASK APPARATUS, METHOD OF MANUFACTURING DEPOSITION MASK APPARATUS AND METHOD OF MANUFACTURING ORGANIC DEVICE

(71) Applicant: Dai Nippon Printing Co., Ltd., Tokyo (JP)

(72) Inventors: Hideyuki Okamoto, Tokyo (JP); Hiroshi Koi, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 121 days.

(21) Appl. No.: 18/168,050

(22) Filed: Feb. 13, 2023

(65) Prior Publication Data

US 2023/0272518 A1 Aug. 31, 2023

(30) Foreign Application Priority Data

Feb. 25, 2022 (JP) ................................. 2022-028624

(51) Int. Cl.
*C23C 14/04* (2006.01)
*C23C 14/24* (2006.01)
*C23C 16/04* (2006.01)

(52) U.S. Cl.
CPC .......... *C23C 14/042* (2013.01); *C23C 14/243* (2013.01); *C23C 16/042* (2013.01)

(58) Field of Classification Search
CPC ............................ C23C 14/042; C23C 16/042
See application file for complete search history.

(56) References Cited

U.S. PATENT DOCUMENTS

| | | | | |
|---|---|---|---|---|
| 2020/0273735 A1* | 8/2020 | Ikenaga | ................. | H10K 71/00 |
| 2021/0348265 A1 | 11/2021 | Okamoto et al. | | |
| 2022/0013396 A1* | 1/2022 | Mei | ..................... | H01J 37/3447 |

FOREIGN PATENT DOCUMENTS

| | | | | |
|---|---|---|---|---|
| CN | 110438448 A | * 11/2019 | .......... | C23C 14/042 |
| JP | 5382259 B1 | 1/2014 | | |
| JP | 2021-147705 A | 9/2021 | | |

OTHER PUBLICATIONS

Japanese Office Action (with English translation) dated Oct. 24, 2025 (Application No. 2022-028624).

* cited by examiner

*Primary Examiner* — Dah-Wei D. Yuan
*Assistant Examiner* — Stephen A Kitt
(74) *Attorney, Agent, or Firm* — BURR PATENT LAW, PLLC

(57) ABSTRACT

A deposition mask apparatus includes a frame, a deposition mask, and an alignment mask. The alignment mask has two first alignment mask holes located at positions different from each other in the second direction and overlapping the frame. A first weld joining the frame with the alignment mask is located in an outer side of the alignment mask in the second direction with respect to a corresponding one of the first alignment mask holes. A second weld joining the frame with the alignment mask is located in an inner side of the alignment mask in the second direction with respect to a corresponding one of the first alignment mask holes.

15 Claims, 14 Drawing Sheets

DEPOSITION MASK APPARATUS, METHOD OF MANUFACTURING DEPOSITION MASK APPARATUS AND METHOD OF MANUFACTURING ORGANIC DEVICE

CROSS REFERENCE TO RELATED APPLICATIONS

This application is based upon and claims the benefit of priority from Japanese Patent Application No. 2022-028624 filed on Feb. 25, 2022, the entire contents of which are incorporated herein by reference.

TECHNICAL FIELD

The present disclosure relates to a deposition mask apparatus, a method of manufacturing a deposition mask apparatus, and a method of manufacturing an organic device.

BACKGROUND ART

In the field of display devices for use in portable devices, such as smartphones and tablet PCs, an organic EL display device has become a focus of attention as an example of an organic device. A method and apparatus for forming pixels by using a deposition mask are known as a manufacturing method and a manufacturing apparatus for an organic semiconductor device, such as an organic EL display device. The deposition mask has through-holes arranged in a desired pattern, so the pixels are formed in the desired pattern. For example, initially, a deposition mask fixed to a frame is combined with a substrate for an organic EL display device. Subsequently, in a deposition apparatus, a deposition material containing an organic material is deposited on the substrate via the through-holes of the deposition mask. By performing such a deposition step, deposition layers containing a deposition material (or light emitting layers of the organic EL display device) can be formed on the substrate as pixels in a pattern corresponding to the through-holes of the deposition mask. The deposition layers make up the light emitting layers of the organic EL display device.

An apparatus made up of a deposition mask and a frame may be called as a deposition mask apparatus. The deposition mask apparatus is aligned in the deposition apparatus such that the deposition mask and the substrate are aligned with each other.

Patent Document 1: JP 5382259 B

SUMMARY

The present disclosure provides a deposition mask apparatus, a method of manufacturing a deposition mask apparatus, and a method of manufacturing an organic EL display device, which are capable of improving alignment accuracy.

A deposition mask apparatus according to the present disclosure includes a frame, a deposition mask, and an alignment mask. The frame has a first frame face, a second frame face located on an opposite side to the first frame face, and a frame opening extending through from the first frame face to the second frame face. The deposition mask is joined to the first frame face. The deposition mask has a plurality of through-holes overlapping the frame opening in plan view. The alignment mask is joined to the first frame face. The alignment mask is arranged side by side with the deposition mask in a first direction. The alignment mask has two first alignment mask holes located at positions different from each other in a second direction orthogonal to the first direction and overlapping the frame. A first weld joining the frame with the alignment mask is located in an outer side of the alignment mask in the second direction with respect to a corresponding one of the first alignment mask holes. A second weld joining the frame with the alignment mask is located in an inner side of the alignment mask in the second direction with respect to a corresponding one of the first alignment mask holes.

A deposition mask apparatus according to the present disclosure includes a frame, a deposition mask, and an alignment mask. The frame has a first frame face, a second frame face located on an opposite side to the first frame face, and a frame opening extending through from the first frame face to the second frame face. The deposition mask is joined to the first frame face. The deposition mask has a plurality of through-holes overlapping the frame opening in plan view. The alignment mask is joined to the first frame face. The alignment mask is arranged side by side with the deposition mask in a first direction. The alignment mask has two first alignment mask holes located at positions different from each other in a second direction orthogonal to the first direction and overlapping the frame. A first weld joining the frame with the alignment mask is located in an outer side of the alignment mask in the second direction with respect to a corresponding one of the first alignment mask holes. Fifth welds joining the frame with the alignment mask, respectively, are located on both sides in the first direction with respect to a corresponding one of the first alignment mask holes.

A method of manufacturing a deposition mask apparatus according to the present disclosure includes a preparation step, a first joining step, and a second joining step. In the preparation step, a frame having a first frame face, a second frame face located on an opposite side to the first frame face, and a frame opening extending through from the first frame face to the second frame face is prepared. In the first joining step, an alignment mask is joined to the first frame face by a first weld and a second weld. In the second joining step, a deposition mask, having a plurality of through-holes overlapping the frame opening in plan view, is joined to the first frame face so as to be arranged side by side with the alignment mask in a first direction. The alignment mask has two first alignment mask holes located at positions different from each other in a second direction orthogonal to the first direction and overlapping the frame. The first weld is located in an outer side of the alignment mask in the second direction with respect to a corresponding one of the first alignment mask holes. The second weld is located in an inner side of the alignment mask in the second direction with respect to a corresponding one of the first alignment mask holes.

A method of manufacturing a deposition mask apparatus according to the present disclosure includes a preparation step, a first joining step, and a second joining step. In the preparation step, a frame having a first frame face, a second frame face located on an opposite side to the first frame face, and a frame opening extending through from the first frame face to the second frame face is prepared. In the first joining step, an alignment mask is joined to the first frame face by a first weld and fifth welds. In the second joining step, a deposition mask, having a plurality of through-holes overlapping the frame opening in plan view, is joined to the first frame face so as to be arranged side by side with the alignment mask in a first direction. The alignment mask has two first alignment mask holes located at positions different from each other in a second direction orthogonal to the first direction and overlapping the frame. The first weld is located in an outer side of the alignment mask in the second direction with respect to a corresponding one of the first alignment mask holes. The fifth welds, respectively, are located in both sides in the first direction with respect to a corresponding one of the first alignment mask holes.

A method of manufacturing an organic device according to the present disclosure includes an apparatus preparation step, an alignment step, a close contact step, and a deposition step. In the apparatus preparation step, the above-described deposition mask apparatus is prepared. In the alignment step, the deposition mask apparatus is aligned with a substrate. In the close contact step, the deposition mask of the deposition mask apparatus is brought into close contact with the substrate. In the deposition step, deposition layers are formed by depositing a deposition material on the substrate through the through-holes of the deposition mask.

According to the present disclosure, it is possible to improve alignment accuracy.

DETAILED DESCRIPTION

Figure 1:
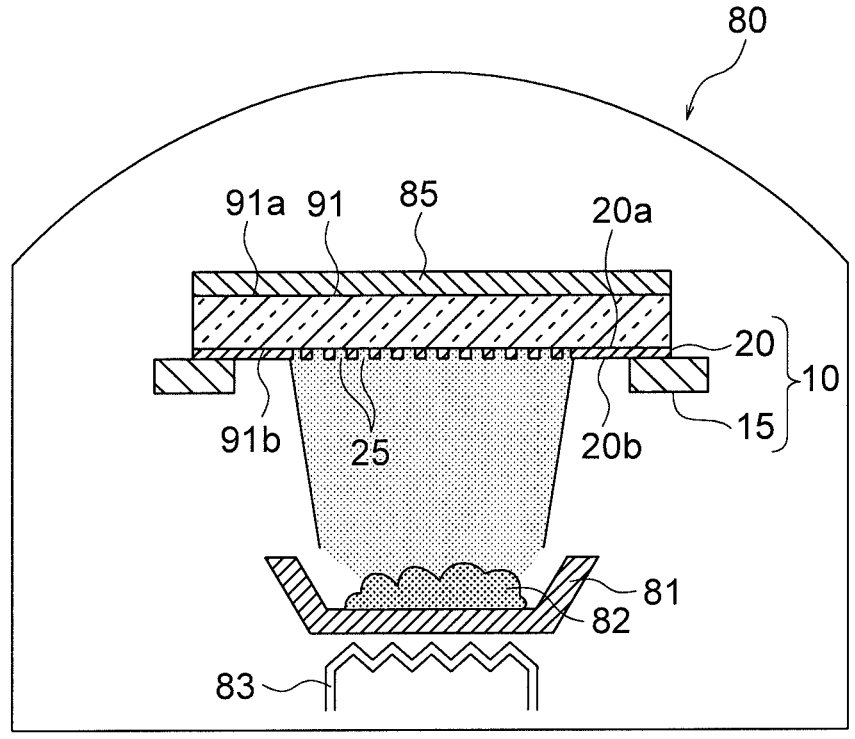
FIG. 1 is a view that shows a deposition apparatus including a deposition mask apparatus according to an embodiment of the present disclosure.

In the specification and the attached drawings, unless otherwise described, terms that mean substances that are the basis of components, such as "substrate", "substrate material", "plate", "sheet", and "film", are not distinguished from one another by the difference in name.

In the specification and the attached drawings, unless otherwise described, terms, such as "parallel" and "orthogonal", values of length and angle, and the like that determine shapes, geometrical conditions and the degrees of them are not limited to strict meanings and are interpreted by including the range of degrees to which similar functions can be expected.

In the specification and the attached drawings, unless otherwise described, when a component of a member, an area, or the like is "on" and "under", "upper side" and "lower side", or "upward" and "downward" of another component of another member, another area, or the like, it includes a case where a component is directly in contact with another component. Furthermore, it also includes a case where further another component is included between a component and another component, that is, a component and another component are indirectly in contact with each other. Unless otherwise described, words "up", "upper side", and "upward", or "down", "lower side", and "downward" may be inverted upside down.

In the specification and the attached drawings, unless otherwise described, the same or similar reference signs denote the same portions or portions having similar functions, and the repeated description can be omitted. The scale ratio of the drawings can be different from the actual ratio for the sake of convenience of illustration, and a portion of components can be omitted from the drawings.

In the specification and the attached drawings, unless otherwise described, an embodiment can be combined with another embodiment or a modification without any contradiction. Alternatively, other embodiments or another embodiment and a modification can also be combined with each other without any contradiction. Alternatively, modifications can also be combined with each other without any contradiction.

In the specification and the attached drawings, unless otherwise described, when a plurality of steps will be described for a method, such as a manufacturing method, another undisclosed step may be performed between the disclosed steps. The order of disclosed steps may be selected without any contradiction.

In the specification and the attached drawings, unless otherwise described, the numeric range expressed by "X" to "Y" includes numeric values assigned to "X" and "Y". For example, a numeric range defined by the expression "34 to 38 percent by mass" is equivalent to a numeric range defined by the expression "higher than or equal to 34 percent by mass and lower than or equal to 38 percent by mass".

In the specification and the attached drawings, unless otherwise described, in an embodiment of the specification, an example related to a deposition mask used to pattern an organic material on a substrate in a desired pattern at the time of manufacturing an organic EL display device and a manufacturing method therefor will be described. However, the uses are not limited thereto, and the present embodiment may be applied to a deposition mask used in various uses.

Hereinafter, an embodiment of the present disclosure will be described in detail with reference to the attached drawings. Embodiments described below are examples of the embodiment of the present disclosure, and the present disclosure should not be interpreted limitedly to only these embodiments.

A first aspect of the present disclosure provides a deposition mask apparatus. The deposition mask apparatus includes a frame having a first frame face, a second frame face located on an opposite side to the first frame face, and a frame opening extending through from the first frame face to the second frame face; a deposition mask joined to the first frame face and having a plurality of through-holes overlapping the frame opening in plan view; and an alignment mask joined to the first frame face and arranged side by side with the deposition mask in a first direction, wherein the alignment mask has two first alignment mask holes located at positions different from each other in a second direction orthogonal to the first direction and overlapping the frame, a first weld joining the frame with the alignment mask is located in an outer side of the alignment mask in the second direction with respect to a corresponding one of the first alignment mask holes, and a second weld joining the frame with the alignment mask is located in an inner side of the alignment mask in the second direction with respect to a corresponding one of the first alignment mask holes.

As a second aspect of the present disclosure, in the deposition mask apparatus according to the above-described first aspect, the first weld may include a plurality of first weld split portions arranged in the first direction, and the second weld may include a plurality of second weld split portions arranged in the first direction.

As a third aspect of the present disclosure, in the deposition mask apparatus according to the above-described first aspect or the above-described second aspect, the frame may have a first frame alignment hole extending from the first frame face toward the second frame face and overlapping any one of the first alignment mask holes in plan view.

As a fourth aspect of the present disclosure, in the deposition mask apparatus according to the above-described third aspect, the first frame alignment holes may extend through from the first frame face to the second frame face.

As a fifth aspect of the present disclosure, in the deposition mask apparatus according to the above-described fourth aspect, the first frame alignment holes may extend in a third direction orthogonal to the first direction and the second direction.

As a sixth aspect of the present disclosure, in the deposition mask apparatus according to any one of the above-described first aspect to the above-described fifth aspect, the first alignment mask holes, respectively, may be located on both sides of the frame opening in the second direction.

As a seventh aspect of the present disclosure, in the deposition mask apparatus according to any one of the above-described first aspect to the above-described sixth aspect, a fifth weld joining the frame with the alignment mask may be located on at least one side of the first alignment mask holes in the first direction.

As an eighth aspect of the present disclosure, in the deposition mask apparatus according to any one of the above-described first aspect to the above-described seventh aspect, the alignment mask may have two second alignment mask holes located at positions different from each other in the second direction and overlapping the frame, and the second alignment mask holes may be located between one of the second welds and the other one of the second welds in the second direction.

As a ninth aspect of the present disclosure, in the deposition mask apparatus according to the above-described eighth aspect, a third weld joining the frame with the alignment mask may be located in an outer side of the alignment mask in the second direction with respect to a corresponding one of the second alignment mask holes, and a fourth weld joining the frame with the alignment mask may be located in an inner side of the alignment mask in the second direction with respect to a corresponding one of the second alignment mask holes.

As a tenth aspect of the present disclosure, in the deposition mask apparatus according to the above-described ninth aspect, the third weld may include a plurality of third weld split portions arranged in the first direction, and the fourth weld may include a plurality of fourth weld split portions arranged in the first direction.

As an eleventh aspect of the present disclosure, in the deposition mask apparatus according to any one of the above-described eighth aspect to the above-described tenth aspect, the frame may have a second frame alignment hole extending from the first frame face toward the second frame face, and the second frame alignment hole may have an alignment frame opening located at the first frame face and overlapping any one of the second alignment mask holes in plan view.

As a twelfth aspect of the present disclosure, in the deposition mask apparatus according to the above-described eleventh aspect, the second frame alignment hole may extend through from the first frame face to the second frame face.

As a thirteenth aspect of the present disclosure, in the deposition mask apparatus according to the above-described twelfth aspect, the second frame alignment hole may be inclined with respect to the first frame face.

As a fourteenth aspect of the present disclosure, in the deposition mask apparatus according to any one of the above-described eighth aspect to the above-described thirteenth aspect, the second alignment mask holes may be located on one side of the frame opening in the first direction.

As a fifteenth aspect of the present disclosure, in the deposition mask apparatus according to any one of the above-described eighth aspect to the above-described fourteenth aspect, a sixth weld joining the frame with the alignment mask may be located on at least one side in the first direction with respect to a corresponding one of the second alignment mask holes.

A sixteenth aspect of the present disclosure provides a deposition mask apparatus. The deposition mask apparatus includes a frame having a first frame face, a second frame face located on an opposite side to the first frame face, a frame opening extending through from the first frame face to the second frame face; a deposition mask joined to the first frame face and having a plurality of through-holes overlapping the frame opening in plan view; and an alignment mask joined to the first frame face and arranged side by side with the deposition mask in a first direction, wherein the alignment mask has two first alignment mask holes located at positions different from each other in a second direction orthogonal to the first direction and overlapping the frame, a first weld joining the frame with the alignment mask is located in an outer side of the alignment mask in the second direction with respect to a corresponding one of the first alignment mask holes, and fifth welds joining the frame with the alignment mask, respectively, are located on both sides in the first direction with respect to a corresponding one of the first alignment mask holes.

As a seventeenth aspect of the present disclosure, in the deposition mask apparatus according to the above-described sixteenth aspect, the alignment mask may have two second alignment mask holes located at positions different from each other in the second direction and overlapping the frame, and the second alignment mask holes may be located between one of the first alignment mask holes and the other one of the first alignment mask holes in the second direction.

As an eighteenth aspect of the present disclosure, in the deposition mask apparatus according to the above-described seventeenth aspect, a third weld joining the frame with the alignment mask may be located in an outer side of the alignment mask in the second direction with respect to a corresponding one of the second alignment mask holes, and sixth welds joining the frame with the alignment mask, respectively, may be located on both sides in the first direction with respect to a corresponding one of the second alignment mask holes.

A nineteenth aspect of the present disclosure provides a method of manufacturing a deposition mask apparatus. The method includes a preparation step of preparing a frame having a first frame face, a second frame face located on an opposite side to the first frame face, and a frame opening extending through from the first frame face to the second frame face; a first joining step of joining an alignment mask to the first frame face by a first weld and a second weld; and a second joining step of joining a deposition mask, having a plurality of through-holes overlapping the frame opening in plan view, to the first frame face so as to be arranged side by side with the alignment mask in a first direction, wherein the alignment mask has two first alignment mask holes located at positions different from each other in a second direction orthogonal to the first direction and overlapping the frame, the first weld is located in an outer side of the alignment mask in the second direction with respect to a corresponding one of the first alignment mask holes, and the second weld is located in an inner side of the alignment mask in the second direction with respect to a corresponding one of the first alignment mask holes.

A twentieth aspect of the present disclosure provides a method of manufacturing a deposition mask apparatus. The method includes a preparation step of preparing a frame having a first frame face, a second frame face located on an opposite side to the first frame face, and a frame opening extending through from the first frame face to the second frame face; a first joining step of joining an alignment mask to the first frame face by a first weld and fifth welds; and a second joining step of joining a deposition mask, having a plurality of through-holes overlapping the frame opening in plan view, to the first frame face so as to be arranged side by side with the alignment mask in a first direction, wherein the alignment mask has two first alignment mask holes located at positions different from each other in a second direction orthogonal to the first direction and overlapping the frame, the first weld is located in an outer side of the alignment mask in the second direction with respect to a corresponding one of the first alignment mask holes, and the fifth welds, respectively, are located in both sides in the first direction with respect to a corresponding one of the first alignment mask holes.

The above-described nineteenth aspect and the above-described twentieth aspect, respectively, may be deposition a mask apparatus manufactured by the method of manufacturing a deposition mask apparatus according to the nineteenth aspect and the twentieth aspect.

A twenty-first aspect of the present disclosure provides a method of manufacturing an organic device. The method includes an apparatus preparation step of preparing the deposition mask apparatus according to any one of the above-described first aspect to the above-described eighteenth aspect; an alignment step of aligning the deposition mask apparatus with a substrate; a close contact step of bringing the deposition mask of the deposition mask apparatus into close contact with the substrate; and a deposition step of forming deposition layers by depositing a deposition material on the substrate through the through-holes of the deposition mask.

The above-described twenty-first aspect may be an organic device manufactured in accordance with the method of manufacturing an organic device according to the twenty-first aspect.

Hereinafter, the deposition mask apparatus, the method of manufacturing for a deposition mask apparatus, and the method of manufacturing an organic device according to the embodiment of the present disclosure will be described with reference to FIGS. 1 to 20.

Initially, a deposition apparatus 80 that performs a deposition process for depositing a deposition material on an object will be described with reference to FIG. 1.

As shown in FIG. 1, the deposition apparatus 80 may include a deposition source such as a crucible 81, a heater 83, and a deposition mask apparatus 10. The deposition apparatus 80 may further include an evacuating unit (not shown) for setting the inside of the deposition apparatus 80 to a vacuum atmosphere. The crucible 81 is provided inside the deposition apparatus 80. The crucible 81 is configured to contain a deposition material 82, such as an organic luminescent material. The heater 83 is configured to heat the crucible 81. When the crucible 81 is heated in the vacuum atmosphere, the deposition material 82 evaporates.

The deposition mask apparatus 10 may be located in the deposition apparatus 80 so as to be opposite to the crucible 81. The deposition mask apparatus 10 may be located above the crucible 81. A substrate 91 is located so as to face a deposition mask 20 of the deposition mask apparatus 10. The substrate 91 is an object on which the deposition material 82 is to be deposited. The substrate 91 may be located on the deposition mask 20. The substrate 91 may be grasped with a clamp (not shown) and held. The deposition material flying from the crucible 81 passes through through-holes 25 (described later) of the deposition mask 20 and adheres to the substrate 91.

As shown in FIG. 1, the deposition apparatus 80 may include a magnet 85 located on the substrate 91. With the magnet 85, the deposition mask 20 is attracted toward the magnet 85 by magnetic force, and the deposition mask 20 can be brought into close contact with the substrate 91. With this configuration, it is possible to reduce the occurrence of shadow (described later) in a deposition step, so it is possible to increase the shape accuracy and position accuracy of deposition layers to be formed from the deposition material 82 deposited on the substrate 91. The deposition layers correspond to light emitting layers 92 (see FIG. 14) of an organic EL display device 90 (described later). A cooling plate (not shown) for cooling the substrate 91 in deposition may be interposed between the substrate 91 and the magnet 85.

Next, the deposition mask apparatus 10 according to the embodiment of the present disclosure will be described with reference to FIGS. 2 to 7.

Figure 2:
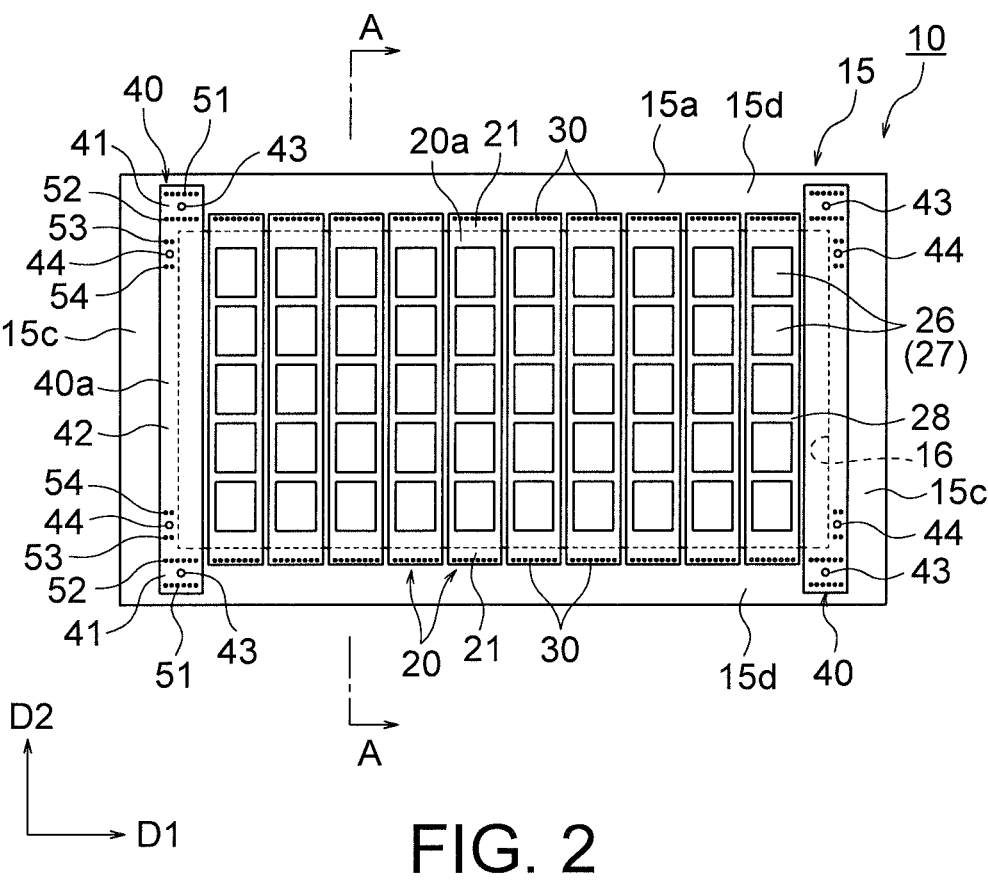
FIG. 2 is a plan view that shows the deposition mask apparatus according to the embodiment of the present disclosure.
Figure 3:
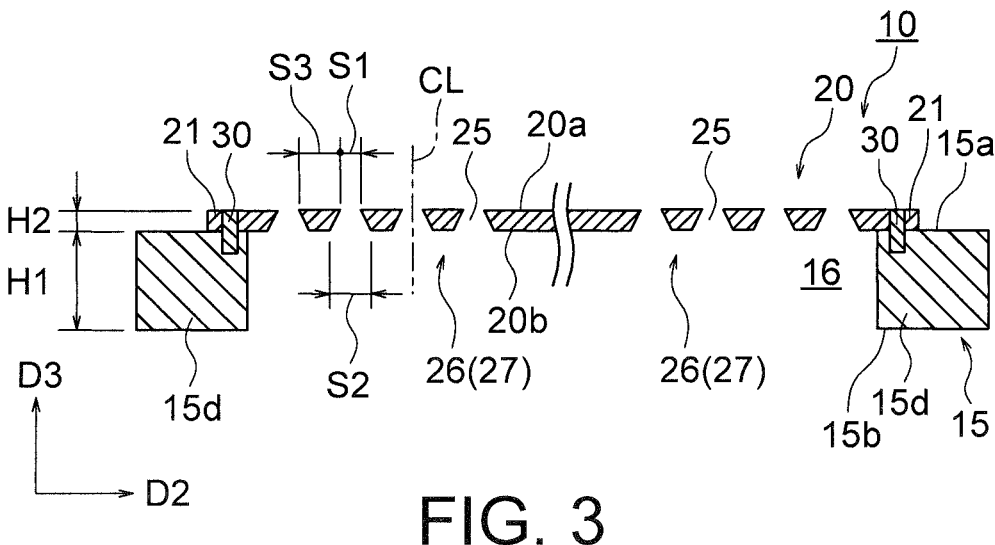
FIG. 3 is a schematic sectional view taken along the line A-A in FIG. 2.

As shown in FIGS. 2 and 3, the deposition mask apparatus 10 according to the present embodiment may include a frame 15, the deposition mask 20 provided on the frame 15, and alignment mask 40 provided on the frame 15. Two or more deposition masks 20 arranged in a first direction D1 may be joined onto the frame 15. In the present embodiment, each of the deposition masks 20 is formed in a long slender shape with a longitudinal direction that coincides with a second direction D2 orthogonal to the first direction D1. Each of the deposition masks 20 has a plurality of through-hole groups 26 arranged in a line in the second direction D2. The plurality of deposition masks 20 may be arranged in the first direction D1 and fixed to the frame 15.

The frame 15 may be supported in a state where the deposition masks 20 are pulled in a direction along the plane of the frame 15. In this case, it is possible to suppress a deflection of the deposition masks 20. In this way, the deposition masks 20 may be fixed to the frame 15 so as to be stretched.

As shown in FIG. 3, the frame 15 may include a first frame face 15a and a second frame face 15b. The first frame face 15a may be a face that contacts with the deposition masks 20. The deposition masks 20 may be joined to the first frame face 15a. The second frame face 15b may be located on an opposite side to the first frame face 15a. FIG. 3 is a schematic sectional view taken along the line A-A in FIG. 2. For the sake of clear illustration, the number of the through-hole groups 26 (described later) and the number of the through-holes 25 (described later) are reduced.

Figure 4:
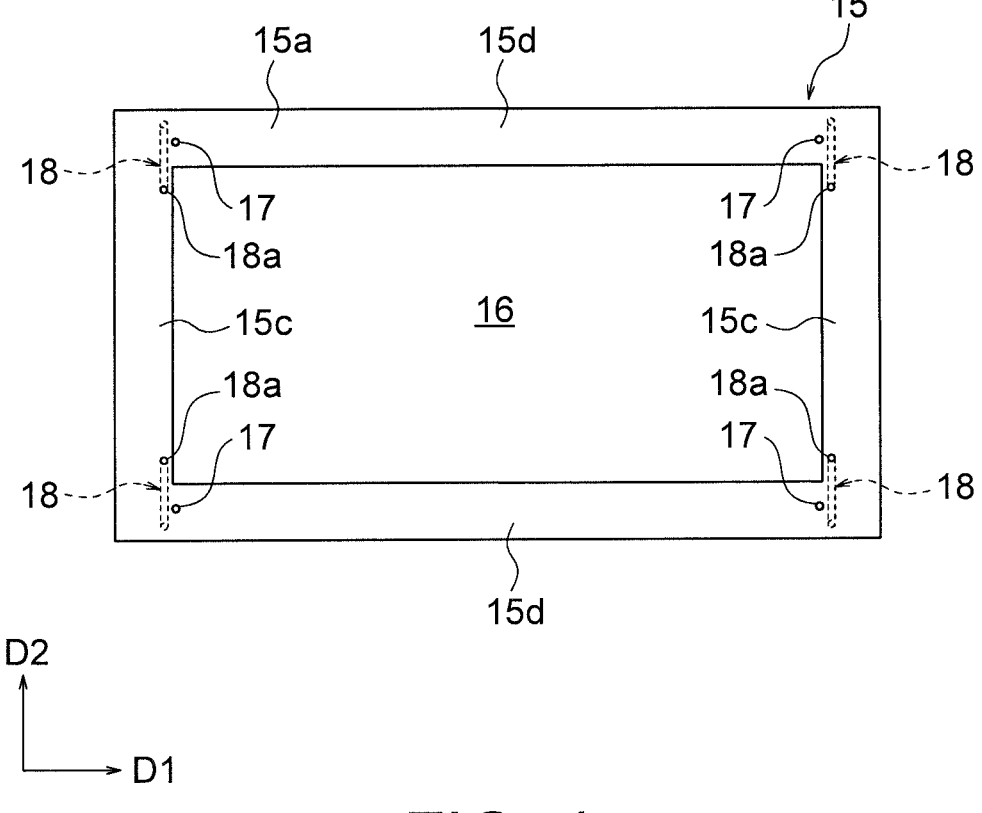
FIG. 4 is a plan view that shows a frame shown in FIG. 2.

As shown in FIGS. 2 and 4, the frame 15 may be formed in a rectangular frame shape in plan view. The frame 15 may have a frame opening 16. The frame opening 16 may extend through from the first frame face 15a to the second frame face 15b. The frame opening 16 may overlap the through-hole groups 26 of the deposition masks 20 in plan view. In the example shown in FIG. 2, the frame opening 16 is formed in a rectangular shape along the first direction D1 and the second direction D2 in plan view. Here, the plan view is a term that means to view in a thickness direction of the deposition masks 20 and is, for example, a term that means to view in a direction perpendicular to the sheet of FIG. 2. The thickness direction is a direction orthogonal to the first direction D1 and orthogonal to the second direction D2 and is, hereinafter, referred to as a third direction D3.

The frame 15 may include two first extended portions 15c and two second extended portions 15d. The first extended portions 15c, respectively, are located on both sides of the frame opening 16 in the first direction D1. The frame opening 16 is located between the two first extended portions 15c. The second extended portions 15d, respectively, are located on both sides of the frame opening 16 in the second direction D2. The frame opening 16 is located between the two second extended portions 15d. The first extended portions 15c and the second extended portions 15d are integrally formed in a continuous manner to make up the frame 15.

As shown in FIG. 4, the frame 15 may have four first frame alignment holes 17 and four second frame alignment holes 18.

The first frame alignment holes 17 may be holes for aligning the frame 15 with the alignment mask 40. The first frame alignment holes 17 may be holes for allowing first alignment mask holes 43 to be visually recognized in a direction from the second frame face 15b of the frame 15 toward the first frame face 15a in a second joining step (described later) (see FIG. 12).

Figure 5:
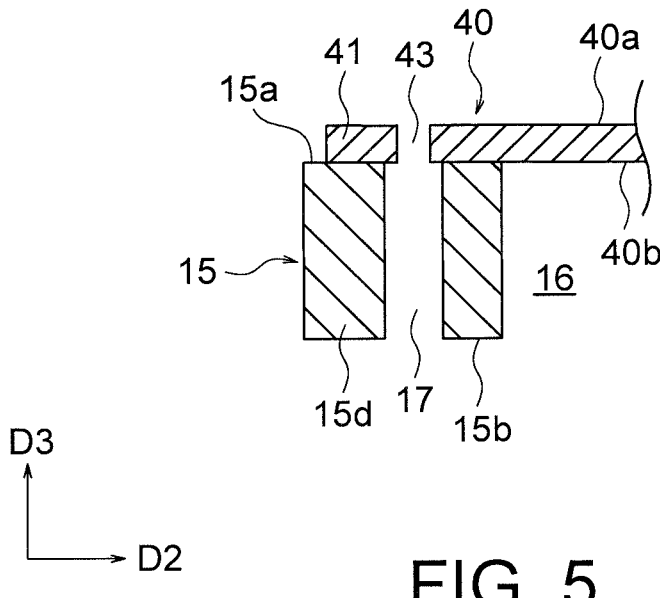
FIG. 5 is a sectional view that shows a first frame alignment hole in the deposition mask apparatus shown in FIG. 2 and is a sectional view taken along the line B-B in FIG. 7.
Figure 7:
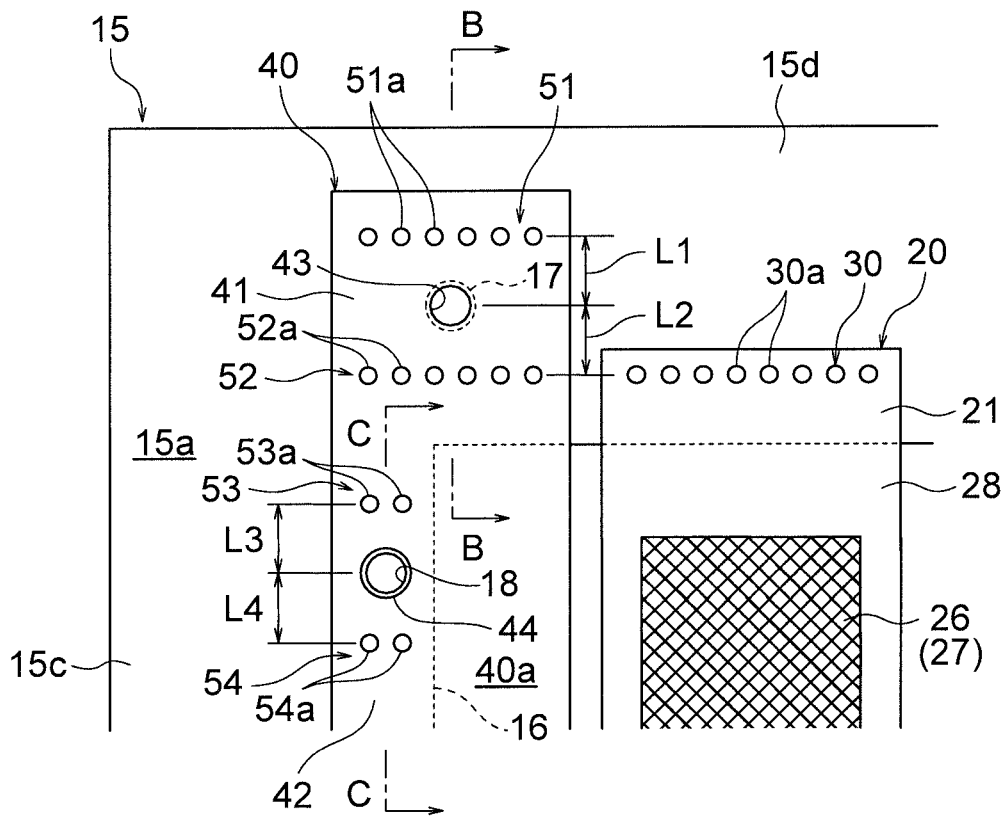
FIG. 7 is a partially enlarged plan view that shows the deposition mask apparatus shown in FIG. 2.

As shown in FIG. 5, each of the first frame alignment holes 17 may extend from the first frame face 15a toward the second frame face 15b. The first frame alignment holes 17 may extend in the third direction D3. The first frame alignment holes 17 may extend perpendicularly to the first frame face 15a or may extend perpendicularly to the second frame face 15b. The first frame alignment holes 17 may extend through from the first frame face 15a to the second frame face 15b. However, each of the first frame alignment holes 17 does not need to extend through the frame 15 as long as the first alignment mask holes 43 can be visually recognized in a direction from a first alignment mask face 40a (described later) of the alignment mask 40 toward a second alignment mask face 40b. The planar shape of each first frame alignment hole 17 is selectable and may be a circular shape as shown in FIG. 7.

As shown in FIG. 4, the four first frame alignment holes 17 may be located at the vertexes of a quadrangle formed along the first direction D1 and the second direction D2. The two first frame alignment holes 17 arranged in the second direction D2, respectively, may be located on both sides of the frame opening 16 in the second direction D2. In the example shown in FIG. 4, the first frame alignment holes 17 located on the upper side are located on the upper side of the frame opening 16, and the first frame alignment holes 17 located on the lower side are located on the lower side of the frame opening 16. Each of the two first frame alignment holes 17 arranged in the second direction D2 corresponds to a corresponding one of the first alignment mask holes 43 (described later) of each of the alignment masks 40.

The second frame alignment holes 18 may be holes to be used in an alignment step of a method of manufacturing the organic EL display device 90. More specifically, the second frame alignment holes 18 may be holes for improving the visibility of the second alignment mask holes 44 when the deposition mask apparatus 10 is aligned with the substrate 91 in the deposition apparatus 80. When the visibility of the second alignment mask holes 44 is improved, it is possible to improve the accuracy of aligning the deposition mask apparatus 10.

Figure 6:
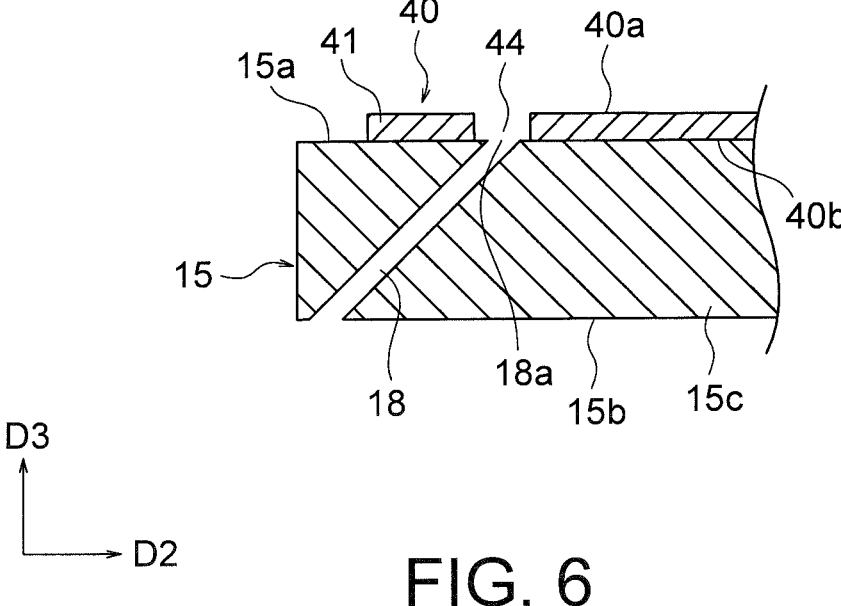
FIG. 6 is a sectional view that shows a second frame alignment hole in the deposition mask apparatus shown in FIG. 2 and is a sectional view taken along the line C-C in FIG. 7.

As shown in FIG. 6, each of the second frame alignment holes 18 may extend from the first frame face 15a toward the second frame face 15b. Each of the second frame alignment holes 18 may be inclined with respect to the first frame face 15a or may be inclined with respect to the second frame face 15b. The second frame alignment holes 18 may extend through from the first frame face 15a to the second frame face 15b. However, each of the second frame alignment holes 18 does not need to extend through the frame 15 as long as the second frame alignment hole 18 has an alignment frame opening 18a (described later).

Each of the second frame alignment holes 18 may have an alignment frame opening 18a located at the first frame face 15a. Each of the alignment frame openings 18a may overlap a corresponding one of the second alignment mask holes 44 (described later) in plan view. The planar shape of the alignment frame opening 18a is selectable and may be a circular shape as shown in FIG. 7.

As shown in FIG. 4, the frame 15 may have four second frame alignment holes 18. The four second frame alignment holes 18 may be located at the vertexes of a quadrangle formed along the first direction D1 and the second direction D2. The two second frame alignment holes 18 arranged in the first direction D1, respectively, may be located on both sides of the frame opening 16 in the first direction D1. In the example shown in FIG. 4, the second frame alignment holes 18 located on the left side are located on the left side of the frame opening 16, and the second frame alignment holes 18 located on the right side are located on the right side of the frame opening 16. Each of the two second frame alignment holes 18 arranged in the second direction D2 corresponds to a corresponding one of the second alignment mask holes 44 (described later) of each of the alignment masks 40.

The frame 15 may be made of the same material as the material of the deposition masks 20 (described later). However, the configuration is not limited thereto. The frame 15 may be made of a material different from the material of the deposition masks 20.

As shown in FIG. 3, the frame 15 has a thickness H1 ranging from the first frame face 15a to the second frame face 15b. The thickness H1, for example, may be greater than or equal to 10 mm, may be greater than or equal to 15 mm, may be greater than or equal to 20 mm, or may be greater than or equal to 25 mm. When the thickness H1 is set to greater than or equal to 10 mm, it is possible to reduce deformation by using a tension received from the stretched deposition masks 20. The thickness H1, for example, may be less than or equal to 25 mm, may be less than or equal to 40 mm, may be less than or equal to 45 mm, or may be less than or equal to 50 mm. When the thickness H1 is set to less than or equal to 50 mm, it is possible to suppress an increase in mass. The range of the thickness H1 may be determined by a first group consisting of 10 mm, 15 mm, 20 mm, and 25 mm and/or a second group consisting of 25 mm, 40 mm, 45 mm, and 50 mm. The range of the thickness H1 may be determined by a combination of any one of the values in the first group and any one of the values in the second group. The range of the thickness H1 may be determined by a combination of any two of the values in the first group. The range of the thickness H1 may be determined by a combination of any two of the values in the second group. The range of the thickness H1, for example, may be greater than or equal to 10 mm and less than or equal to 50 mm, may be greater than or equal to 10 mm and less than or equal to 45 mm, may be greater than or equal to 10 mm and less than or equal to 40 mm, may be greater than or equal to 10 mm and less than or equal to 25 mm, may be greater than or equal to 10 mm and less than or equal to 20 mm, may be greater than or equal to 10 mm and less than or equal to 15 mm, may be greater than or equal to 15 mm and less than or equal to 50 mm, may be greater than or equal to 15 mm and less than or equal to 45 mm, may be greater than or equal to 15 mm and less than or equal to 40 mm, may be greater than or equal to 15 mm and less than or equal to 25 mm, may be greater than or equal to 15 mm and less than or equal to 20 mm, may be greater than or equal to 20 mm and less than or equal to 50 mm, may be greater than or equal to 20 mm and less than or equal to 45 mm, may be greater than or equal to 20 mm and less than or equal to 40 mm, may be greater than or equal to 20 mm and less than or equal to 25 mm, may be greater than or equal to 25 mm and less than or equal to 50 mm, may be greater than or equal to 25 mm and less than or equal to 45 mm, may be greater than or equal to 25 mm and less than or equal to 40 mm, may be greater than or equal to 25 mm and less than or equal to 25 mm, may be greater than or equal to 40 mm and less than or equal to 50 mm, may be greater than or equal to 40 mm and less than or equal to 45 mm, or may be greater than or equal to 45 mm and less than or equal to 50 mm.

Next, each of the deposition masks 20 according to the embodiment of the present disclosure will be described with reference to FIGS. 2 and 3.

As shown in FIG. 3, the deposition mask 20 may include a first mask face 20a and a second mask face 20b. The first mask face 20a may be a face that closely contacts with the substrate 91 (see FIG. 1) in deposition. The second mask face 20b may be located on an opposite side to the second mask face 20b. The second mask face 20b may be a face that contacts with the frame 15.

As shown in FIGS. 2 and 3, the deposition mask 20 may include two overlap portions 21. The overlap portions 21, respectively, may be located in both sides of the deposition mask 20 in the second direction D2. Each of the overlap portions 21 may overlap a corresponding one of the second extended portions 15d on the first frame face 15a. The overlap portions 21 are portions located outside the through-hole groups 26 (described later) in the second direction D2 in plan view. Part of each of the overlap portions 21 is cut out and removed after the deposition mask 20 is joined with the frame 15.

As shown in FIG. 3, the deposition mask 20 may have two or more through-holes 25. The deposition mask 20 may have a through-hole group 26 made up of two or more through-holes 25. In the present embodiment, as shown in FIG. 2, each of the deposition masks 20 has two or more through-hole groups 26 arranged in the second direction D2. The through-hole groups 26 are located between the two overlap portions 21 in the second direction D2.

As shown in FIG. 3, the through-holes 25 extend from the first mask face 20a to the second mask face 20b and extend through the deposition mask 20. For the sake of simple illustration, FIG. 3 shows an example in which the wall of each through-hole 25 is linearly inclined with respect to a central axis CL so as to go away from the central axis CL from the first mask face 20a toward the second mask face 20b. In this way, the wall of each through-hole 25 may be formed such that an opening size at the first mask face 20a is smaller than an opening size at the second mask face 20b. In this case, it is possible to reduce the arrival of the deposition material 82 flying from the crucible 81 of the deposition apparatus 80 at the second mask face 20b before arriving at the substrate 91. In this case, it is possible to reduce the arrival of the deposition material 82 at the wall of the through-hole 25 and the adhesion of the deposition material 82 to the wall. It is possible to reduce a reduction in the thickness of the light emitting layers 92 formed on the substrate 91 near the walls of the through-holes 25. As a result, it is possible to reduce the occurrence of shadow. Shadow means that the adhesion of the deposition material 82 to the substrate 91 is blocked by the wall of the through-hole 25. Therefore, it is possible to improve the shape accuracy and position accuracy of the light emitting layers 92 (see FIG. 14) to be formed from the deposition material 82 deposited on the substrate 91, so it is possible to increase the definition of the light emitting layers 92. Although the further detailed description of the sectional shape of each through-hole 25 is omitted here, the shape of the wall of each through-hole 25 may be a curved shape and is selectable according to a method of manufacturing the deposition mask 20.

As shown in FIGS. 2 and 3, the through-hole groups 26 overlap the frame opening 16 of the frame 15 and are exposed through the frame opening 16. The through-holes 25 overlap the frame opening 16 in plan view. All the through-hole groups 26 may overlap the frame opening 16. Each of the through-hole groups 26 may be made up of a group of two or more through-holes 25. A through-hole group 26 is used as a term that means a collection of a plurality of through-holes 25 arranged regularly. Outer-edge through-holes 25 that are components of one through-hole group 26 are through-holes 25 located at the outermost side of a plurality of through-holes 25 arranged regularly similarly. Through-holes 25 arranged regularly similarly and intended to pass the deposition material 82 do not need to be present outside the outer-edge through-holes 25. However, through-holes or recesses (which are not shown) for other purposes may be formed outside the outer-edge through-holes 25. The through-holes or the recesses for other purposes may be formed without the regularity of the array of through-holes 25 and may be regarded as not belonging to the through-hole group 26.

As shown in FIG. 2, the plurality of through-hole groups 26 may be arranged at predetermined intervals. The through-hole groups 26 may be arranged at predetermined intervals in the second direction D2. Although not shown in the drawings, the through-hole groups 26 may be arranged in each of the first direction D1 and the second direction D2 and may be arranged in parallel. More specifically, the through-hole groups 26 that make up one line along the first direction D1 and the through-hole groups 26 that make up another line adjacent to the one line in the second direction D2 may be aligned in the second direction D2.

In one through-hole group 26, the plurality of through-holes 25 may be arranged at predetermined intervals. The through-holes 25 may be arranged at predetermined intervals in the first direction D1 and may be arranged at predetermined intervals in the second direction D2. The arrangement pitch of the through-holes 25 in the first direction D1 may be different from the arrangement pitch of the through-holes 25 in the second direction D2 or may be equal to the arrangement pitch of the through-holes 25 in the second direction D2. The arrangement pitch of the through-holes 25 may be, for example, determined as follows according to the pixel density of a display device or a projection device.

When the pixel density is higher than or equal to 600 ppi: the pitch is less than or equal to 42.3 μm.

When the pixel density is higher than or equal to 1200 ppi: the pitch is less than or equal to 21.2 μm.

When the pixel density is higher than or equal to 3000 ppi: the pitch is less than or equal to 8.5 μm.

When the pixel density is higher than or equal to 5000 ppi: the pitch is less than or equal to 5.1 μm.

A display device or a projection device with a pixel density of 600 ppi may be used so as to display an image or smartphone. A display device or a projection device with a pixel density of 1200 ppi may be used so as to display an image or a video at a distance of about 8 cm from an eye and may be, for example, used to display or project an image or a video for expressing a virtual reality (so-called VR). A display device or a projection device with a pixel density of 3000 ppi may be used so as to display an image or a video at a distance of about 3 cm from an eye and may be, for example, used to display or project an image or a video for expressing an augmented reality (so-called AR). A display device or a projection device with a pixel density of 5000 ppi may be used so as to display an image or a video at a distance of about 2 cm from an eye and may be, for example, used to display or project an image or a video for expressing an augmented reality.

The through-holes 25 in one through-hole group 26 may be arranged not in parallel but in staggered arrangement (not shown). In other words, the through-holes 25 that make up one line along the first direction D1 and the through-holes 25 that make up another line adjacent to the one line in the second direction D2 do not need to be aligned in the second direction D2. The through-holes 25 that make up one line and the through-holes 25 that make up adjacent another line may be arranged so as to be shifted in the first direction D1. The shift amount may be a half of an arrangement pitch Cl in the first direction D1, and the arrangement pitch is selectable.

Each of the through-holes 25 may have a substantially rectangular outline in plan view. The outline shape can be selectively determined according to the shape of each pixel. The outline may have, for example, another polygonal shape, such as a hexagonal shape and an octagonal shape, or may have a circular shape. Alternatively, the outline shape may be a combination of a plurality of shapes. Alternatively, the through-holes 25, respectively, may have outline shapes different from each other. When the through-hole 25 has an outline with a polygonal shape, the opening size of the through-hole 25 may be a spacing between a pair of opposite sides in a polygon.

In FIG. 3, the opening size of each through-hole 25 at the first mask face 20a of the deposition mask 20 is indicated by the sign S1. The opening size of each through-hole 25 at the second mask face 20b of the deposition mask 20 is indicated by the sign S2. The sign S3 indicates a distance between the through-holes 25 adjacent to each other at the first mask face 20a.

The size S1, the size S2, and the size S3 are determined as shown in, for example, the following Table 1 according to the pixel density of a display device or a projection device.

TABLE 1

| Pixel Density | S1 | S2 | S3 |
|---|---|---|---|
| 600 ppi | 14.0 μm or Greater 28.0 μm or Less | 14.0 μm or Greater 40.0 μm or Less | 14.0 μm or Greater 28.0 μm or Less |
| 1200 ppi | 7.0 μm or Greater 15.0 μm or Less | 7.0 μm or Greater 19.0 μm or Less | 6.0 μm or Greater 14.0 μm or Less |
| 3000 ppi | 3.0 μm or Greater 6.0 μm or Less | 3.0 μm or Greater 7.0 μm or Less | 2.5 μm or Greater 5.5 μm or Less |
| 5000 ppi | 1.7 μm or Greater 3.4 μm or Less | 1.7 μm or Greater 4.0 μm or Less | 1.7 μm or Greater 3.4 μm or Less | a video at a distance of about 15 cm from an eye and may be, for example, used as an organic EL display device for a The through-hole group 26 may be referred to as an effective area 27. An area located around each effective area 27 may be referred to as a surrounding area 28. In the present embodiment, the surrounding area 28 surrounds one effective area 27.

When a display device, such as an organic EL display device, is made by using the deposition mask 20, one effective area 27 corresponds to a display area of one organic EL display device. Therefore, with the deposition masks 20 shown in FIG. 2, multiple-imposition deposition of an organic EL display device is possible. One effective area 27 may correspond to a plurality of display areas.

Each of the effective areas 27 may have, for example, an outline with a substantially rectangular shape in plan view. The outline of each effective area 27 may be defined by a line that is tangent from outside to the through-holes 25 located at the outermost side of a corresponding one of the through-hole groups 26. More specifically, the outline of each effective area 27 may be defined by a line that is tangent to the openings of the through-holes 25. In the example shown in FIG. 2, the outline of each effective area 27 is an outline with a substantially rectangular shape. Although not shown in the drawing, each of the effective areas 27 may have an outline with any one of various shapes according to the shape of the display area of an organic EL display device. For example, each of the effective areas 27 may have an outline with a circular shape.

As shown in FIG. 3, the deposition mask 20 has a thickness H2 ranging from the first mask face 20a to the second mask face 20b. The thickness H2, for example, may be greater than or equal to 2 μm, may be greater than or equal to 5 μm, may be greater than or equal to 10 μm, or may be greater than or equal to 15 μm. When the thickness H2 is set to greater than or equal to 2 μm, it is possible to ensure the mechanical strength of the deposition mask 20. The thickness H2, for example, may be less than or equal to 20 μm, may be less than or equal to 30 μm, may be less than or equal to 40 μm, or may be less than or equal to 50 μm. When the thickness H2 is set to less than or equal to 50 μm, it is possible to reduce the occurrence of shadow. The range of the thickness H2 may be determined by a first group consisting of 2 μm, 5 μm, 10 μm, and 15 μm and/or a second group consisting of 20 μm, 30 μm, 40 μm, and 50 μm. The range of the thickness H2 may be determined by a combination of any one of the values in the first group and any one of the values in the second group. The range of the thickness H2 may be determined by a combination of any two of the values in the first group. The range of the thickness H2 may be determined by a combination of any two of the values in the second group. The range of the thickness H2, for example, may be greater than or equal to 2 μm and less than or equal to 50 μm, may be greater than or equal to 2 μm and less than or equal to 40 μm, may be greater than or equal to 2 μm and less than or equal to 30 μm, may be greater than or equal to 2 μm and less than or equal to 20 μm, may be greater than or equal to 2 μm and less than or equal to 15 μm, may be greater than or equal to 2 μm and less than or equal to 10 μm, may be greater than or equal to 2 μm and less than or equal to 5 μm, may be greater than or equal to 5 μm and less than or equal to 50 μm, may be greater than or equal to 5 μm and less than or equal to 40 μm, may be greater than or equal to 5 μm and less than or equal to 30 μm, may be greater than or equal to 5 μm and less than or equal to 20 μm, may be greater than or equal to 5 μm and less than or equal to 15 μm, may be greater than or equal to 5 μm and less than or equal to 10 μm, may be greater than or equal to 10 μm and less than or equal to 50 μm, may be greater than or equal to 10 μm and less than or equal to 40 μm, may be greater than or equal to 10 μm and less than or equal to 30 μm, may be greater than or equal to 10 μm and less than or equal to 20 μm, may be greater than or equal to 10 μm and less than or equal to 15 μm, may be greater than or equal to 15 μm and less than or equal to 50 μm, may be greater than or equal to 15 μm and less than or equal to 40 μm, may be greater than or equal to 15 μm and less than or equal to 30 μm, may be greater than or equal to 15 μm and less than or equal to 20 μm, may be greater than or equal to 20 μm and less than or equal to 50 μm, may be greater than or equal to 20 μm and less than or equal to 40 μm, may be greater than or equal to 20 μm and less than or equal to 30 μm, may be greater than or equal to 30 μm and less than or equal to 50 μm, may be greater than or equal to 30 μm and less than or equal to 40 μm, or may be greater than or equal to 40 μm and less than or equal to 50 μm.

The deposition mask 20 may be made of a metal material. The metal material may be a magnetic metal material. The deposition mask 20 may be made of, for example, an iron alloy containing nickel. The iron alloy may further contain cobalt in addition to nickel. Examples of the material of the deposition mask 20 include iron alloys of which the content of nickel and cobalt in total is higher than or equal to 30 percent by mass and lower than or equal to 54 percent by mass and the content of cobalt is higher than or equal to zero percent by mass and lower than or equal to six percent by mass. Specific examples of iron alloys containing nickel include Invar that contains nickel with a content higher than or equal to 34 percent by mass and lower than or equal to 38 percent by mass, and low-thermal expansion Fe—Ni plating alloys that contain nickel with a content higher than or equal to 38 percent by mass and lower than or equal to 54 percent by mass. Specific examples of iron alloys containing nickel and cobalt include Super-Invar that further contains cobalt in addition to nickel with a content higher than or equal to 30 percent by mass and lower than or equal to 34 percent by mass. When such iron alloys are used, it is possible to reduce the thermal expansion coefficient of the deposition mask 20. When, for example, a glass substrate is used as the substrate 91, the thermal expansion coefficient of the deposition mask 20 can be set to a low value equivalent to that of the glass substrate. With this configuration, it is possible to suppress a decrease in the shape accuracy and position accuracy of the light emitting layers 92 to be formed on the substrate 91 due to a difference in thermal expansion coefficient between the deposition mask 20 and the substrate 91 in a deposition step.

When the thermal expansion coefficient does not need to be set to a low value equivalent to that of the glass substrate, the material that is a component of the deposition mask 20, for example, may be a nickel element or may be a nickel alloy containing cobalt, instead of the above-described iron alloys. When the material of the deposition mask 20 is made of a nickel alloy containing cobalt, a nickel alloy of which the content of cobalt is higher than or equal to eight percent by mass and lower than or equal to 10 percent by mass may be used as the material of the deposition mask 20. By using such nickel or a nickel alloy, when the deposition mask 20 is manufactured by plating, it is possible to stabilize a plating solution to precipitate a plated coating serving as the deposition mask 20, so it is possible to provide easy management and improve handleability. It is possible to uniform the components of a plated coating and to improve the quality of the deposition mask 20.

As shown in FIGS. 2, 3, and 7, deposition mask weld 30 may be formed in the deposition masks 20. The deposition mask weld 30 join the frame 15 with the deposition masks 20.

The deposition mask welds 30 may be located at the overlap portions 21. Each of the deposition mask welds 30 may include a plurality of weld split portions 30*a* arranged in the first direction D1. The weld split portions 30*a* may be formed in a dot shape in plan view and/or may be formed from the deposition mask 20 to the frame 15. For example, the weld split portions 30*a* may be formed by spot welding. The number of the weld split portions 30*a* may be one, may be two or more, and is selectable.

Each of the deposition mask welds 30 is not limited to including the plurality of weld split portions 30*a*. Although not shown in the drawings, for example, each of the deposition mask welds 30 may be formed so as to extend continuously in the first direction D1.

Next, the alignment mask 40 according to the embodiment of the present disclosure will be described with reference to FIGS. 2, and 5 to 7.

As shown in FIG. 2, the two alignment masks 40 may be joined with the frame 15. The alignment masks 40 may be joined to the first frame face 15*a* of the frame 15. The alignment masks 40 may be fixed to the frame 15 so as to be stretched.

As shown in FIGS. 5 and 6, the alignment mask 40 may have the first alignment mask face 40*a* and the second alignment mask face 40*b*. The first alignment mask face 40*a* may be a face with which the substrate 91 closely contacts in deposition. The second alignment mask face 40*b* may be located on an opposite side to the first alignment mask face 40*a*. The second alignment mask face 40*b* may be a face that contacts with the above-described frame 15.

As shown in FIG. 2, each of the alignment masks 40 may be arranged side by side with the deposition mask 20 in the first direction D1. More specifically, the alignment mask 40 may be located on one side of the frame opening 16 in the first direction D1. One of the alignment masks 40 may overlap one of the first extended portions 15*c* in plan view and may be arranged side by side in the first direction D1 with the deposition mask 20 located near the first extended portion 15*c*. The other one of the alignment masks 40 may overlap the other one of the first extended portions 15*c* in plan view and may be arranged side by side in the first direction D1 with the deposition mask 20 located near the first extended portion 15*c*. In the example shown in FIG. 2, the left-side alignment mask 40 may overlap the left-side first extended portion 15*c* in plan view and may be located on the left side of the deposition mask 20 located at the leftmost side. The right-side alignment mask 40 may overlap the right-side first extended portion 15*c* in plan view and may be located on the right side of the deposition mask 20 located at the rightmost side.

As shown in FIGS. 2 and 7, the alignment mask 40 may include two first alignment overlap portions 41 and a second alignment overlap portion 42.

The first alignment overlap portions 41, respectively, are located on both sides of the frame opening 16 in the second direction D2. The first alignment overlap portions 41, respectively, overlap the second extended portions 15*d* on the first frame face 15*a* in plan view. In the example shown in FIG. 2, the upper-side first alignment overlap portion 41 is located on the upper side of the frame opening 16 and overlaps the upper-side second extended portion 15*d*. The lower-side first alignment overlap portion 41 is located on the lower side of the frame opening 16 and overlaps the lower-side second extended portion 15*d*.

The second alignment overlap portion 42 is located on one side of the frame opening 16 in the first direction D1. The second alignment overlap portion 42 overlaps the first extended portion 15*c* on the first frame face 15*a* in plan view. In the example shown in FIG. 2, the second alignment overlap portion 42 of the left-side alignment mask 40 is located on the left side of the frame opening 16 and overlaps the left-side first extended portion 15*c*. The second alignment overlap portion 42 of the right-side alignment mask 40 is located on the right side of the frame opening 16 and overlaps the right-side first extended portion 15*c*.

As shown in FIG. 2, each of the alignment masks 40 may have two first alignment mask holes 43 and two second alignment mask holes 44.

The first alignment mask holes 43 may be holes for aligning the frame 15 with the alignment mask 40. The first alignment mask holes 43 may be holes for setting the origin of coordinates for defining the positions of the through-holes 25 of the deposition mask 20 in a second joining step (described later).

The first alignment mask holes 43 may be located at positions different from each other in the second direction D2 and may overlap the frame 15. The first alignment mask holes 43, respectively, may be located at the corresponding first alignment overlap portions 41. The first alignment mask holes 43, respectively, may be located on both sides of the frame opening 16 in the second direction D2. In the example shown in FIG. 2, the upper-side first alignment mask hole 43 is located on the upper side of the frame opening 16, and the lower-side first alignment mask hole 43 is located on the lower side of the frame opening 16. As shown in FIG. 7, the first alignment mask holes 43, respectively, may be located at positions that overlap the corresponding first frame alignment holes 17 in plan view.

As shown in FIG. 5, the first alignment mask hole 43 may extend from the first alignment mask face 40*a* to the second alignment mask face 40*b* and extend through the alignment mask 40. However, the first alignment mask holes 43 do not need to extend through the alignment mask 40 as long as the first alignment mask holes 43 can align the frame 15 with the alignment mask 40 and set the origin of coordinates for defining the positions of the through-holes 25 of the deposition mask 20. The planar shape of each first alignment mask hole 43 is selectable and may be a circular shape as shown in FIG. 7.

As shown in FIGS. 5 and 7, the first alignment mask holes 43, respectively, may overlap the corresponding first frame alignment holes 17 in plan view. When the planar shape of each of the first alignment mask holes 43 and the first frame alignment holes 17 is circular, the diameter of each of the first alignment mask holes 43 may be less than the diameter of each of the first frame alignment holes 17.

The second alignment mask holes 44 may be holes to be used in an alignment step of the method of manufacturing the organic EL display device 90. More specifically, the second alignment mask holes 44 may be holes for aligning the deposition mask apparatus 10 with the substrate 91 in the deposition apparatus 80.

As shown in FIGS. 2 and 7, the second alignment mask holes 44 may be located at positions different from each other in the second direction D2 and may overlap the frame 15. The second alignment mask holes 44 may be located at the second alignment overlap portion 42. The two second alignment mask holes 44 may be located at the second alignment overlap portion 42. The two second alignment mask holes 44 may be spaced apart from each other in the second direction D2. In the example shown in FIG. 2, the second alignment mask holes 44 of the left-side alignment mask 40 are located on the left side of the frame opening 16, and the second alignment mask holes 44 of the right-side alignment mask 40 are located on the right side of the frame opening 16.

The second alignment mask holes 44 may be located between two second alignment welds 52 arranged in the second direction D2. For example, as shown in FIG. 2, the second alignment mask holes 44 may be located between the upper-side second alignment weld 52 and the lower-side second alignment weld 52 in the second direction D2.

As shown in FIG. 6, each of the second alignment mask holes 44 may extend from the first alignment mask face 40a to the second alignment mask face 40b and extend through the alignment mask 40. However, the second alignment mask holes 44 do not need to extend through the alignment mask 40 as long as the second alignment mask holes 44 can align the deposition mask apparatus 10 with the substrate 91. The planar shape of each second alignment mask hole 44 is selectable and may be a circular shape as shown in FIG. 7.

As shown in FIGS. 6 and 7, the second alignment mask holes 44, respectively, may overlap alignment frame openings 18a of the corresponding second frame alignment holes 18 in plan view. When the planar shape of each of the second alignment mask hole 44 and the alignment frame opening 18a is circular, the diameter of the second alignment mask hole 44 may be greater than the diameter of the alignment frame opening 18a.

As shown in FIGS. 2 and 7, first alignment weld 51 and the second alignment weld 52 may be formed in the alignment mask 40. The first alignment weld 51 and the second alignment weld 52 join the frame 15 with the alignment mask 40. The first alignment weld 51 is an example of a first weld, and the second alignment weld 52 is an example of a second weld.

The first alignment weld 51 and the second alignment weld 52 may be located at the first alignment overlap portion 41. The first alignment welds 51 may be located in the outer side of the alignment mask 40 in the second direction D2 with respect to a corresponding one of the first alignment mask holes 43. In this case, each of the first alignment welds 51 is located at a position farther from the center of the alignment mask 40 in the second direction D2 than a corresponding one of the first alignment mask holes 43. The second alignment welds 52 may be located in the inner side of the alignment mask 40 in the second direction D2 with respect to a corresponding one of the first alignment mask holes 43. In this case, each of the second alignment welds 52 is located at a position closer to the center of the alignment mask 40 in the second direction D2 than a corresponding one of the first alignment mask holes 43. In the second direction D2, each of the first alignment mask holes 43 may be located between the first alignment weld 51 and the second alignment weld 52.

As shown in FIG. 7, the first alignment weld 51 may include a plurality of first weld split portions 51a arranged in the first direction D1. The second alignment weld 52 may include a plurality of second weld split portions 52a arranged in the first direction D1. The first weld split portions 51a and the second weld split portions 52a may be formed in a dot shape in plan view and may be formed from the alignment mask 40 to the frame 15. For example, the first weld split portions 51a and the second weld split portions 52a may be formed by spot welding. The number of the first weld split portions 51a may be one, may be two or more, and is selectable. The number of the second weld split portions 52a may be one, may be two or more, and is selectable. The first weld split portions 51a and the second weld split portions 52a may be formed so as not to be raised with respect to the first alignment mask face 40a.

The first alignment weld 51 is not limited to including the plurality of first weld split portions 51a. Although not shown in the drawing, for example, the first alignment weld 51 may be formed so as to extend continuously in the first direction D1. Similarly, the second alignment weld 52 may also be formed so as to extend continuously in the first direction D1.

As shown in FIG. 7, the first alignment weld 51 and the first alignment mask hole 43 may be spaced apart from each other by a distance L1. The distance L1 is a distance in the second direction D2 between the center of the first alignment weld 51 and the center of the first alignment mask hole 43 in plan view. The second alignment weld 52 and the first alignment mask hole 43 may be spaced apart from each other by a distance L2. The distance L2 is a distance in the second direction D2 between the center of the second alignment weld 52 and the center of the first alignment mask hole 43 in plan view.

The distance L1, for example, may be greater than or equal to 5.0 mm, may be greater than or equal to 5.5 mm, or may be greater than or equal to 6.0 mm. When the distance L1 is set to greater than or equal to 5.0 mm, it is possible to reduce the influence of welding distortion of the first alignment weld 51 on the first alignment mask hole 43. The distance L1, for example, may be less than or equal to 6.5 mm, may be less than or equal to 7.0 mm, or may be less than or equal to 7.5 mm. When the distance L1 is set to less than or equal to 7.5 mm, it is possible to suppress a distance from the first alignment mask hole 43 to the first alignment weld 51. The range of the distance L1 may be determined by a first group consisting of 5.0 mm, 5.5 mm, and 6.0 mm and/or a second group consisting of 6.5 mm, 7.0 mm, and 7.5 mm. The range of the distance L1 may be determined by a combination of any one of the values in the first group and any one of the values in the second group. The range of the distance L1 may be determined by a combination of any two of the values in the first group. The range of the distance L1 may be determined by a combination of any two of the values in the second group. The range of the distance L1, for example, may be greater than or equal to 5.0 mm and less than or equal to 7.5 mm, may be greater than or equal to 5.0 mm and less than or equal to 7.0 mm, may be greater than or equal to 5.0 mm and less than or equal to 6.5 mm, may be greater than or equal to 5.0 mm and less than or equal to 6.0 mm, may be greater than or equal to 5.0 mm and less than or equal to 5.5 mm, may be greater than or equal to 5.5 mm and less than or equal to 7.5 mm, may be greater than or equal to 5.5 mm and less than or equal to 7.0 mm, may be greater than or equal to 5.5 mm and less than or equal to 6.5 mm, may be greater than or equal to 5.5 mm and less than or equal to 6.0 mm, may be greater than or equal to 6.0 mm and less than or equal to 7.5 mm, may be greater than or equal to 6.0 mm and less than or equal to 7.0 mm, may be greater than or equal to 6.0 mm and less than or equal to 6.5 mm, may be greater than or equal to 6.5 mm and less than or equal to 7.5 mm, may be greater than or equal to 6.5 mm and less than or equal to 7.0 mm, or may be greater than or equal to 7.0 mm and less than or equal to 7.5 mm.

The distance L2, for example, may be greater than or equal to 3.5 mm, may be greater than or equal to 4.0 mm, or may be greater than or equal to 4.5 mm. When the distance L2 is set to greater than or equal to 3.5 mm, it is possible to reduce the influence of welding distortion of the second alignment weld 52 on the first alignment mask hole 43. The distance L2, for example, may be less than or equal to 4.0 mm, may be less than or equal to 4.5 mm, or may be less than or equal to 5.0 mm. When the distance L2 is set to less than or equal to 5.0 mm, it is possible to suppress a distance from the first alignment mask hole 43 to the second alignment weld 52. The range of the distance L2 may be determined by a first group consisting of 3.5 mm, 4.0 mm, and 4.5 mm and/or a second group consisting of 4.0 mm, 4.5 mm, and 5.0 mm. The range of the distance L2 may be determined by a combination of any one of the values in the first group and any one of the values in the second group. The range of the distance L2 may be determined by a combination of any two of the values in the first group. The range of the distance L2 may be determined by a combination of any two of the values in the second group. The range of the distance L2, for example, may be greater than or equal to 3.5 mm and less than or equal to 5.0 mm, may be greater than or equal to 3.5 mm and less than or equal to 4.5 mm, may be greater than or equal to 3.5 mm and less than or equal to 4.0 mm, may be greater than or equal to 4.0 mm and less than or equal to 5.0 mm, may be greater than or equal to 4.0 mm and less than or equal to 4.5 mm, or may be greater than or equal to 4.0 mm and less than or equal to 4.0 mm, or may be greater than or equal to 4.5 mm and less than or equal to 5.0 mm, or may be greater than or equal to 4.5 mm and less than or equal to 4.5 mm.

As shown in FIGS. 2 and 7, third alignment weld 53 and fourth alignment weld 54 may be formed in the alignment mask 40. The third alignment weld 53 and the fourth alignment weld 54 join the frame 15 with the alignment mask 40. The third alignment weld 53 is an example of a third weld, and the fourth alignment weld 54 is an example of a fourth weld.

The third alignment weld 53 and the fourth alignment weld 54 may be located at the second alignment overlap portion 42. The third alignment welds 53 may be located in the outer side of the alignment mask 40 in the second direction D2 with respect to a corresponding one of the second alignment mask holes 44. In this case, each of the third alignment welds 53 is located at a position farther from the center of the alignment mask 40 in the second direction D2 than a corresponding one of the second alignment mask holes 44. The fourth alignment welds 54 may be located in the inner side of the alignment mask 40 in the second direction D2 with respect to a corresponding one of the second alignment mask holes 44. In this case, each of the fourth alignment welds 54 is located at a position closer to the center of the alignment mask 40 in the second direction D2 than a corresponding one of the second alignment mask holes 44. In the second direction D2, each of the second alignment mask holes 44 may be located between the third alignment weld 53 and the fourth alignment weld 54.

As shown in FIG. 7, the third alignment weld 53 may include a plurality of third weld split portions 53*a* arranged in the first direction D1. The fourth alignment weld 54 may include a plurality of fourth weld split portions 54*a* arranged in the second direction D2. The third weld split portions 53*a* and the fourth weld split portions 54*a* may be formed in a dot shape in plan view and may be formed from the alignment mask 40 to the frame 15. For example, the third weld split portions 53*a* and the fourth weld split portions 54*a* may be formed by spot welding. The number of the third weld split portions 53*a* may be one, may be two or more, and is selectable. The number of the fourth weld split portions 54*a* may be one, may be two or more, and is selectable. The third weld split portions 53*a* and the fourth weld split portions 54*a* may be formed so as not to be raised with respect to the first alignment mask face 40*a*.

The third alignment weld 53 is not limited to including the plurality of third weld split portions 53*a*. Although not shown in the drawing, for example, the third alignment weld 53 may be formed so as to extend continuously in the first direction D1. Similarly, the fourth alignment weld 54 may also be formed so as to extend continuously in the first direction D1.

As shown in FIG. 7, the third alignment weld 53 and the second alignment mask hole 44 may be spaced apart from each other by a distance L3. The distance L3 is a distance in the second direction D2 between the center of the third alignment weld 53 and the center of the second alignment mask hole 44 in plan view. The fourth alignment weld 54 and the second alignment mask hole 44 may be spaced apart from each other by a distance L4. The distance L4 is a distance in the second direction D2 between the center of the fourth alignment weld 54 and the center of the second alignment mask hole 44 in plan view.

The distance L3, for example, may be greater than or equal to 8.0 mm, may be greater than or equal to 8.5 mm, or may be greater than or equal to 9.0 mm. When the distance L3 is set to greater than or equal to 8.0 mm, it is possible to reduce the influence of welding distortion of the third alignment weld 53 on the second alignment mask hole 44. The distance L3, for example, may be less than or equal to 10.5 mm, may be less than or equal to 11.0 mm, or may be less than or equal to 11.5 mm. When the distance L3 is set to less than or equal to 11.5 mm, it is possible to suppress a distance from the second alignment mask hole 44 to the third alignment weld 53. The range of the distance L3 may be determined by a first group consisting of 8.0 mm, 8.5 mm, and 9.0 mm and/or a second group consisting of 10.5 mm, 11.0 mm, and 11.5 mm. The range of the distance L3 may be determined by a combination of any one of the values in the first group and any one of the values in the second group. The range of the distance L3 may be determined by a combination of any two of the values in the first group. The range of the distance L3 may be determined by a combination of any two of the values in the second group. The range of the distance L3, for example, may be greater than or equal to 8.0 mm and less than or equal to 11.5 mm, may be greater than or equal to 8.0 mm and less than or equal to 11.0 mm, may be greater than or equal to 8.0 mm and less than or equal to 10.5 mm, may be greater than or equal to 8.0 mm and less than or equal to 9.0 mm, may be greater than or equal to 8.0 mm and less than or equal to 8.5 mm, may be greater than or equal to 8.5 mm and less than or equal to 11.5 mm, may be greater than or equal to 8.5 mm and less than or equal to 11.0 mm, may be greater than or equal to 8.5 mm and less than or equal to 10.5 mm, may be greater than or equal to 8.5 mm and less than or equal to 9.0 mm, may be greater than or equal to 9.0 mm and less than or equal to 11.5 mm, may be greater than or equal to 9.0 mm and less than or equal to 11.0 mm, may be greater than or equal to 9.0 mm and less than or equal to 10.5 mm, may be greater than or equal to 10.5 mm and less than or equal to 11.5 mm, may be greater than or equal to 10.5 mm and less than or equal to 11.0 mm, or may be greater than or equal to 11.0 mm and less than or equal to 11.5 mm.

The distance L4, for example, may be greater than or equal to 8.0 mm, may be greater than or equal to 8.5 mm, or may be greater than or equal to 9.0 mm. When the distance L4 is set to greater than or equal to 8.0 mm, it is possible to reduce the influence of welding distortion of the fourth alignment weld 54 on the second alignment mask hole 44. The distance L4, for example, may be less than or equal to 10.5 mm, may be less than or equal to 11.0 mm, or may be less than or equal to 11.5 mm. When the distance L4 is set to less than or equal to 11.5 mm, it is possible to suppress a distance from the second alignment mask hole 44 to the fourth alignment weld 54. The range of the distance L4 may be determined by a first group consisting of 8.0 mm, 8.5 mm, and 9.0 mm and/or a second group consisting of 10.5 mm, 11.0 mm, and 11.5 mm. The range of the distance L4 may be determined by a combination of any one of the values in the first group and any one of the values in the second group. The range of the distance L4 may be determined by a combination of any two of the values in the first group. The range of the distance L4 may be determined by a combination of any two of the values in the second group. The range of the distance L4, for example, may be greater than or equal to 8.0 mm and less than or equal to 11.5 mm, may be greater than or equal to 8.0 mm and less than or equal to 11.0 mm, may be greater than or equal to 8.0 mm and less than or equal to 10.5 mm, may be greater than or equal to 8.0 mm and less than or equal to 9.0 mm, may be greater than or equal to 8.0 mm and less than or equal to 8.5 mm, may be greater than or equal to 8.5 mm and less than or equal to 11.5 mm, may be greater than or equal to 8.5 mm and less than or equal to 11.0 mm, may be greater than or equal to 8.5 mm and less than or equal to 10.5 mm, may be greater than or equal to 8.5 mm and less than or equal to 9.0 mm, may be greater than or equal to 9.0 mm and less than or equal to 11.5 mm, may be greater than or equal to 9.0 mm and less than or equal to 11.0 mm, may be greater than or equal to 9.0 mm and less than or equal to 10.5 mm, may be greater than or equal to 10.5 mm and less than or equal to 11.5 mm, may be greater than or equal to 10.5 mm and less than or equal to 11.0 mm, or may be greater than or equal to 11.0 mm and less than or equal to 11.5 mm.

The alignment mask 40 may be made of the same material as the material of the above-described deposition mask 20. However, the configuration is not limited thereto. The frame 15 may be made of a material different from the material of the deposition mask 20.

Next, a method of manufacturing the deposition mask apparatus 10 made up of such a configuration according to the present embodiment will be described with reference to FIGS. 8 to 11. The method of manufacturing the deposition mask apparatus 10 according to the present embodiment may include a frame preparation step, a deposition mask preparation step, an alignment mask preparation step, a first joining step, and a second joining step. The deposition mask apparatus 10 may be manufactured in a stretching apparatus (not shown).

Initially, the above-described frame 15 may be prepared as the preparation step. The frame 15 can be manufactured by a selected manufacturing method. For example, the frame 15 may be manufactured by machining a sheet material, a forging material, or the like. For example, the first frame alignment holes 17 and the second frame alignment holes 18 may be formed by machining. The frame 15 may be attached to the above-described stretching apparatus.

The above-described deposition masks 20 may be prepared as the deposition mask preparation step. As described above, the deposition masks 20 may be manufactured by a selected manufacturing method, such as etching of a rolled material, plating, or the like. When the deposition masks 20 are manufactured by plating, each of the deposition masks 20 may be made up of two or more layers. In this case, the through-holes 25 are formed so as to extend through these layers.

The above-described alignment masks 40 may be prepared as the alignment mask preparation step. The alignment masks 40, as well as the deposition masks 20, may be similarly manufactured by a selected manufacturing method, such as etching of a rolled material, plating, or the like.

Figure 8:
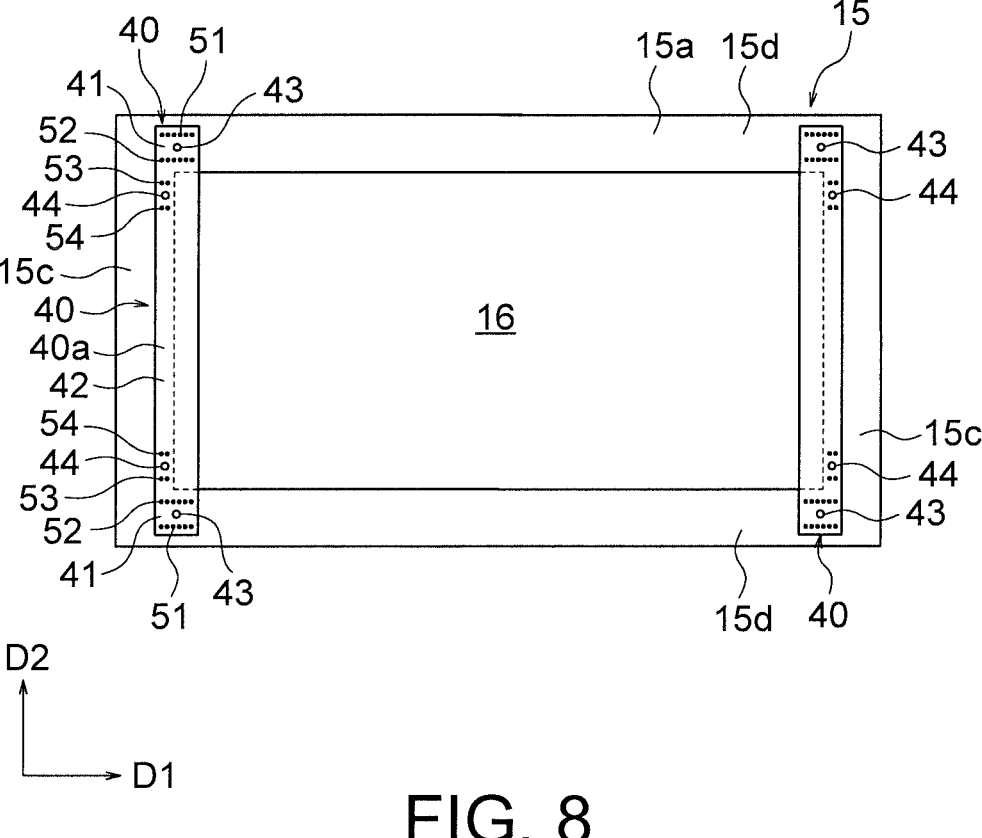
FIG. 8 is a view that shows a first joining step in a method of manufacturing the deposition mask apparatus according to the embodiment of the present disclosure.

After the preparation steps, as shown in FIG. 8, the two alignment masks 40 may be joined to the first frame face 15a of the frame 15 by the alignment welds 51 to 54 as the first joining step.

More specifically, initially, the alignment masks 40 are aligned at desired positions on the first frame face 15a while a tension is applied mainly in the second direction D2. At this time, the first alignment mask holes 43 are aligned with the corresponding first frame alignment holes 17. For example, the first frame alignment holes 17 and the first alignment mask holes 43 may be viewed with a camera 61 (see FIG. 12) in a direction from the second frame face 15b toward the first frame face 15a and aligned with each other. When the diameter of the first alignment mask hole 43 is less than the diameter of the first frame alignment hole 17, the camera 61 can easily visually recognize the first alignment mask hole 43. When the alignment masks 40 are aligned with the frame 15, the first alignment overlap portions 41 overlap the second extended portions 15d, and the second alignment overlap portions 42 overlap the first extended portions 15c, in plan view.

Figure 9:
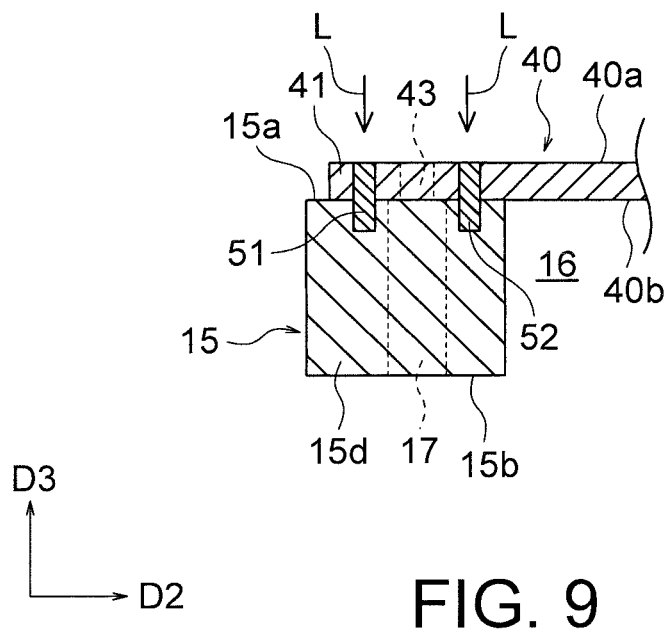
FIG. 9 is a view that shows a manner in which a first alignment weld and a second alignment weld are formed in the first joining step shown in FIG. 8.
Figure 10:
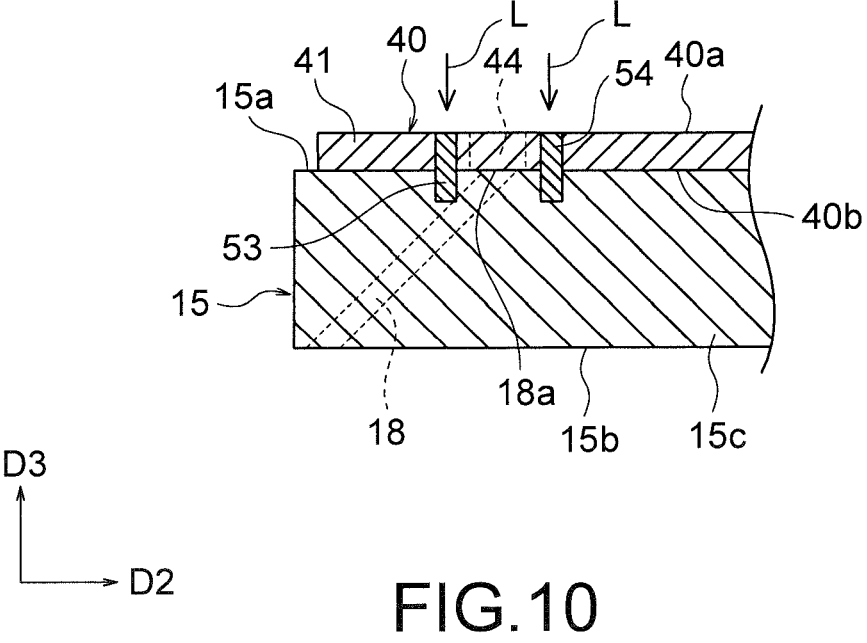
FIG. 10 is a view that shows a manner in which a third alignment weld and a fourth alignment weld are formed in the first joining step shown in FIG. 8.

After the alignment masks 40 are aligned, the alignment masks 40 are joined with the frame 15 by the alignment welds 51 to 54 as shown in FIGS. 8 to 10. In a state where a tension is applied to the alignment masks 40, the alignment welds 51 to 54 are formed. For example, the alignment masks 40 may be joined with the frame 15 by spot welding using laser beam L. In this case, as shown in FIGS. 9 and 10, the laser beam L is applied to the first alignment mask face 40a of the alignment mask 40. In an area to which the laser beam L is applied, a fusion zone is formed in an area from the first alignment mask face 40a across the second alignment mask face 40b to the frame 15. When the fusion zone is cooled to solidify, the first weld split portions 51a and the second weld split portions 52a are formed at each of the first alignment overlap portions 41, and the third weld split portions 53a and the fourth weld split portions 54a are formed at each of the second alignment overlap portions 42.

In this way, the alignment masks 40 are joined with the frame 15 and fixed to the frame 15.

Figure 11:
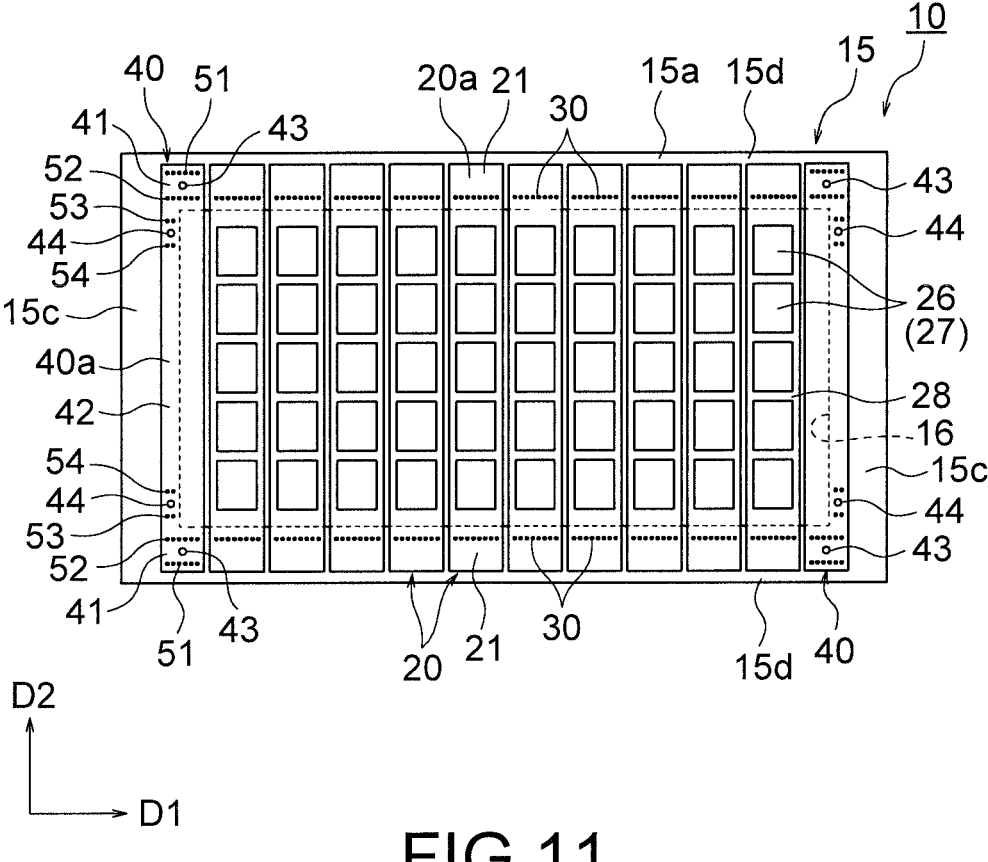
FIG. 11 is a view that shows a second joining step in the method of manufacturing the deposition mask apparatus according to the embodiment of the present disclosure.

After the first joining step, as shown in FIG. 11, the plurality of deposition masks 20 may be joined to the first frame face 15a of the frame 15 as the second joining step. The plurality of deposition masks 20 is arranged in the first direction D1 with respect to the alignment masks 40.

More specifically, initially, the deposition masks 20 are aligned at desired positions on the first frame face 15a while a tension is applied mainly in the second direction D2. At this time, the positions of the through-holes 25 with respect to the frame 15 are checked. More specifically, whether the position of each through-hole 25 is set within an allowable range with respect to a desired position may be checked. For example, the coordinates of each through-hole 25 with respect to the origin, set in accordance with the four first alignment mask holes 43, may be measured, and the measured coordinates may be compared with target coordinates of the through-hole 25.

Figure 12:
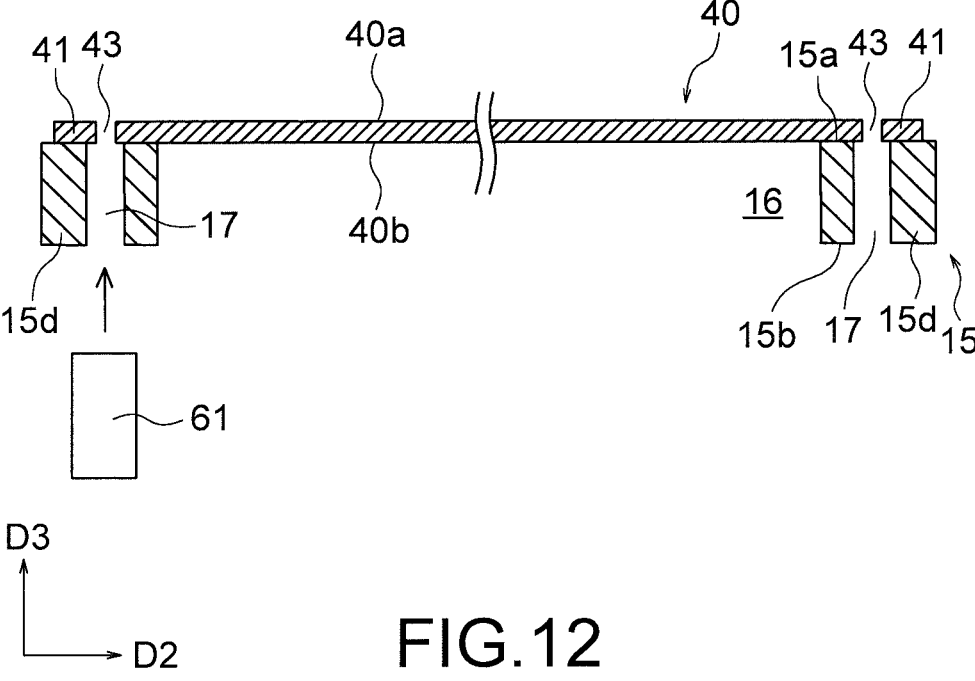
FIG. 12 is a view that shows a manner in which first alignment mask holes are visually recognized in the second joining step shown in FIG. 11.
Figure 13:
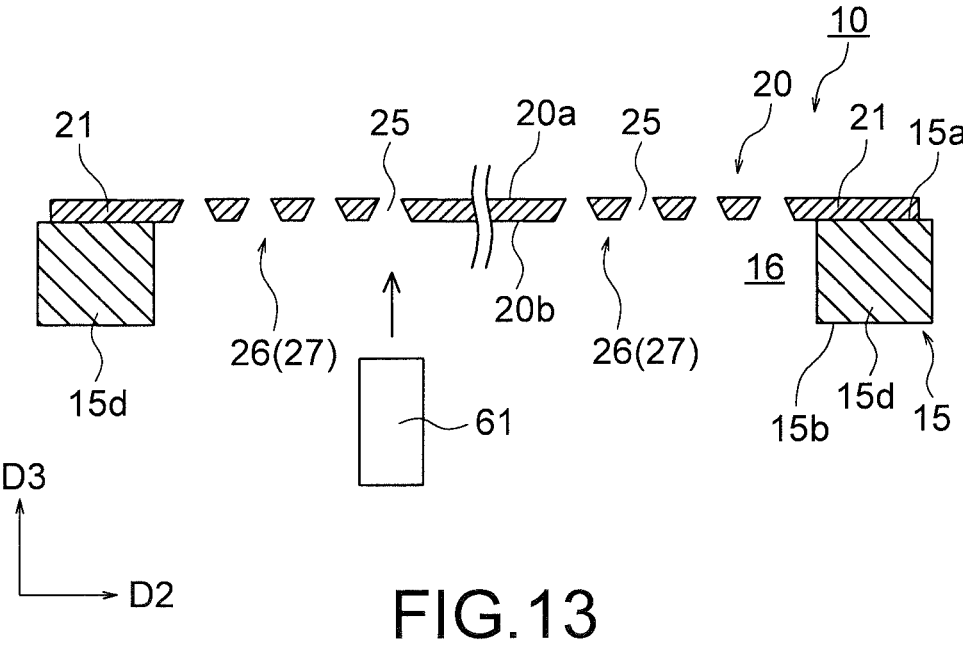
FIG. 13 is a view that shows a manner in which through-holes are visually recognized in the second joining step shown in FIG. 11.

For example, an intersection of two straight lines each passing through the centers of the two first alignment mask holes 43 located in a diagonal line may be defined as an origin. As shown in FIG. 12, the center of each first alignment mask hole 43 may be measured by visually recognizing the first alignment mask hole 43 with the camera 61 in a direction from the second frame face 15b toward the first frame face 15a and performing image analysis. The coordinates of a through-hole 25 may be the central point of the through-hole 25 in plan view. As shown in FIG. 13, the coordinates of each through-hole 25 may be measured by visually recognizing the through-hole 25 with the camera 61 in a direction from the second frame face 15b toward the first frame face 15a and performing image analysis. Measurement of coordinates may be performed for the plurality of through-holes 25 to check the positions of the plurality of through-holes 25. A tension to be applied to the deposition masks 20 may be adjusted such that the position of each through-hole 25 is set at a desired position. When the deposition masks 20 are aligned, the overlap portions 21 overlap the second extended portions 15d in plan view.

After the deposition masks 20 are aligned, the deposition masks 20 are joined with the frame 15 as shown in FIG. 11. In a state where a tension is applied to the deposition masks 20, the weld split portions 30a of the deposition mask welds 30 are formed. The deposition mask welds 30 may be formed similarly to the above-described alignment welds 51 to 54. The weld split portions 30a of the deposition mask welds 30 are formed at the overlap portions 21.

In this way, the deposition masks 20 are joined with the frame 15 and fixed to the frame 15.

After the second joining step, part of each of the overlap portions 21 of the deposition masks 20 is cut (also referred to as trimmed) as the cutting step. In this case, the deposition masks 20 are cut at positions outside the deposition mask welds 30 in the second direction D2 in the overlap portions 21 of the deposition masks 20.

In this way, the deposition mask apparatus 10 shown in FIG. 2 is obtained. The deposition mask apparatus 10 is taken out from the stretching apparatus.

Next, a method of manufacturing an organic device using the deposition mask apparatus 10 according to the present embodiment will be described with reference to FIGS. 1, and 14 to 18. Hereinafter, the organic EL display device 90 will be described as an example of the organic device.

Figure 14:
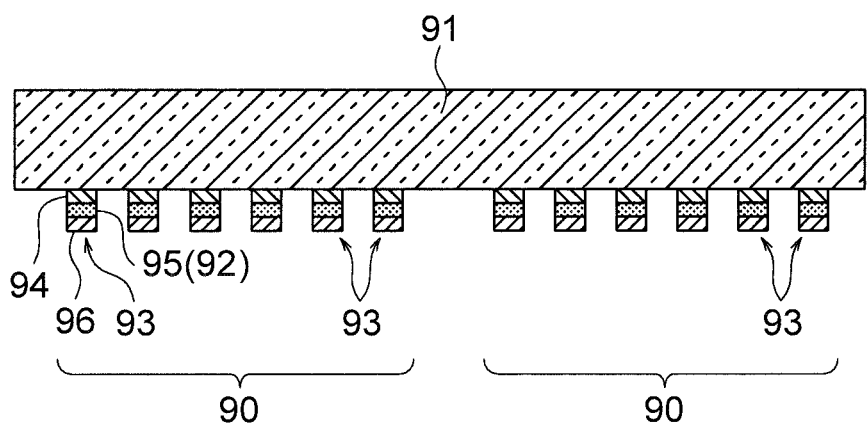
FIG. 14 is a schematic sectional view of an organic EL display device obtained by using a method of manufacturing the organic EL display device according to the embodiment of the present disclosure.

Here, the organic EL display device 90 will be described with reference to FIG. 14. FIG. 14 is a schematic sectional view that shows the organic EL display device 90. The organic EL display device 90 includes the light emitting layers 92 formed on the substrate 91 by using the deposition mask apparatus 10 according to the above-described present embodiment. The light emitting layers 92 are an example of deposition layers. One organic EL display device 90 may correspond to one display area.

More specifically, as shown in FIG. 14, a plurality of elements 93 is provided so as to be arranged on one face of the substrate 91. Although not shown in the drawing, the elements 93 may be arranged in a depth direction of the sheet of FIG. 14. The elements 93 may be configured as pixels. Each of the elements 93 may include a first electrode 94, an energization layer 95, and a second electrode 96. The first electrode 94 may be located on the substrate 91. The energization layer 95 may be located on the first electrode 94. The second electrode 96 may be located on the energization layer 95. The energization layer 95 may include the light emitting layer 92. One organic EL display device 90 is made up of the plurality of elements 93. The elements 93 of the plurality of organic EL display devices 90 may be formed on one substrate 91 to be imposed in multiple areas. In this case, the individual organic EL display devices 90 are obtained by cutting the substrate 91 for each organic EL display device 90. FIG. 14 shows an example in which two organic EL display devices 90 are formed on one substrate 91 as an example.

As shown in FIG. 1, the substrate 91 may include a first substrate face 91a and a second substrate face 91b. The second substrate face 91b may be located on an opposite side to the first substrate face 91a. The second substrate face 91b may be a face that closely contacts with the first mask face 20a of the deposition mask 20 in deposition.

Figure 15:
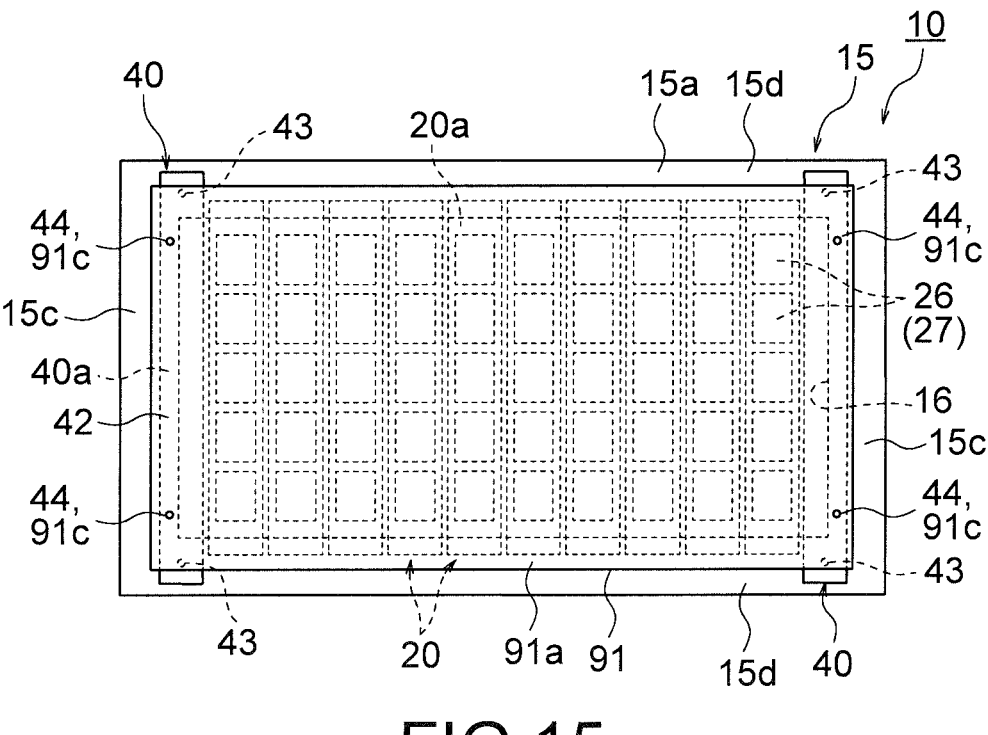
FIG. 15 is a view that shows an alignment step in the method of manufacturing the organic EL display device according to the embodiment of the present disclosure.

As shown in FIG. 15, the substrate 91 may have substrate alignment holes 91c. The substrate alignment holes 91c may extend from the first substrate face 91a to the second substrate face 91b (see FIG. 16) and extend through the substrate 91. However, the substrate alignment holes 91c do not need to extend through the substrate 91 as long as the substrate alignment holes 91c can be aligned with the second alignment mask holes 44. The planar shape of the substrate alignment hole 91c is selectable. The planar shape of the substrate alignment hole 91c may be a circular shape as shown in FIG. 15. When the substrate 91 has transparency for visible light, the diameter of the substrate alignment hole 91c may be equal to the diameter of the second alignment mask hole 44 or may be different from the diameter of the second alignment mask hole 44. In this case, the diameter of the substrate alignment hole 91c may be greater or may be less than the diameter of the second alignment mask hole 44. When the substrate 91 has no transparency for visible light, the diameter of the substrate alignment hole 91c may be less than the diameter of the second alignment mask hole 44.

The substrate 91 may be a sheet-like member having electrical insulation properties. The substrate 91 may have light transparency to transmit light. The substrate 91, for example, may be a glass substrate or may be a silicon substrate. The substrate 91 may be made of, for example, quartz, polyimide having light transparency, or liquid crystal polymer having light transparency.

As shown in FIG. 14, the first electrode 94 contains a material having electrical conductivity. For example, the first electrode 94 may contain a metal, a metal oxide having electrical conductivity, another inorganic material, or the like. The first electrode 94 may contain a metal oxide having light transparency and electrical conductivity, such as indium tin oxide.

The energization layer 95 may include the light emitting layer 92 that emits light when energized, as described above. In this case, the energization layer 95 may include a hole injection layer, a hole transport layer, an electron transport layer, an electron injection layer, and the like. When, for example, the first electrode 94 is an anode and the second electrode 96 is a cathode, a hole injection layer, a hole transport layer, the light emitting layer 92, an electron transport layer, an electron injection layer, and the second electrode 96 are laminated in this order on the first electrode 94. Energization means that a voltage is applied to the energization layer 95 or a current flows through the energization layer 95. In FIG. 14, for the sake of simple illustration, the hole injection layer, the hole transport layer, the electron transport layer, and the electron injection layer are omitted.

The second electrode 96 contains a material having electrical conductivity, such as a metal. Examples of the material of the second electrode 96 include platinum, gold, silver, copper, iron, tin, chromium, aluminum, indium, lithium, sodium, potassium, calcium, magnesium, carbon, and alloys of them.

When the organic EL display device 90 displays an image, a voltage is applied between the first electrode 94 and the second electrode 96 that are components of each of the elements 93. As a result, light is emitted from the light emitting layer 92 of each of the elements 93, the emitted light is taken out in a direction from the light emitting layer 92 toward the first electrode 94 or taken out in a direction from the light emitting layer 92 toward the first electrode 94. A desired image is displayed by controlling emission of light from the light emitting layer 92 in each of the elements 93.

Next, the method of manufacturing the organic EL display device 90 according to the embodiment of the present disclosure will be described with reference to FIGS. 15 to 18. The organic EL display device 90 may be manufactured in the deposition apparatus 80 shown in FIG. 1.

The method of manufacturing the organic EL display device 90 may include a step of forming the light emitting layers 92 by depositing the deposition material 82 on the substrate 91 with the deposition mask apparatus 10. More specifically, the method of manufacturing the organic EL display device according to the present embodiment may include a substrate preparation step, an apparatus preparation step, a substrate alignment step, a close contact step, and a deposition step.

Initially, the above-described substrate 91 may be prepared as the substrate preparation step.

The above-described deposition mask apparatus 10 may be prepared as the apparatus preparation step. The deposition mask apparatus 10 may be attached to the above-described deposition apparatus 80.

Figures 16, 17:
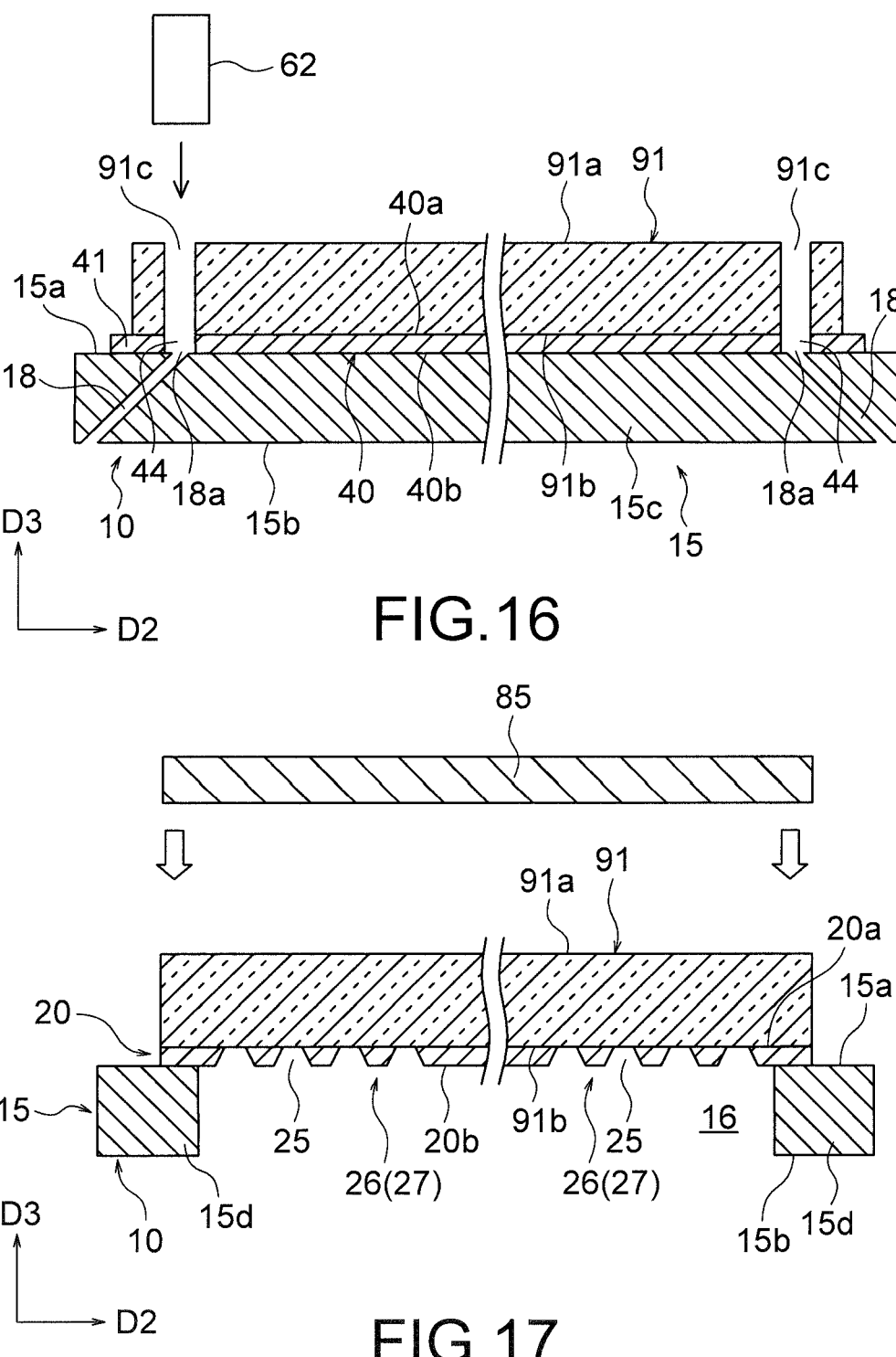
FIG. 16 is a view that shows a manner in which substrate alignment holes and second alignment mask holes are visually recognized in the alignment step shown in FIG. 15.
FIG. 17 is a view that shows a close contact step in the method of manufacturing the organic EL display device according to the embodiment of the present disclosure.

After the apparatus preparation step, as shown in FIG. 15, the deposition mask apparatus 10 and the substrate 91 are aligned with each other as the alignment step. For example, the position of at least one of the deposition mask apparatus 10 and the substrate 91 may be adjusted such that the second alignment mask holes 44 of the alignment masks 40 and the substrate alignment holes 91c of the substrate 91 are aligned with each other. In this case, initially, as shown in FIG. 16, the substrate 91 is set on the first mask face 20a of the deposition mask 20. Subsequently, alignment may be performed by visually recognizing the substrate alignment holes 91c and the second alignment mask holes 44 with a camera 62 in a direction from the first substrate face 91a of the substrate 91 toward the second substrate face 91b. When the substrate 91 is capable of transmitting visible light, the camera 62 can visually recognize the substrate alignment holes 91c and the second alignment mask holes 44 regardless of the magnitude relation between the substrate alignment mask holes 91c and the second alignment mask holes 44. When the diameter of the second alignment mask holes 44 is greater than the diameter of the alignment frame openings 18a of the second frame alignment holes 18, the camera 62 can easily visually recognize the second alignment mask holes 44. In the alignment step, the substrate 91 may be held by a clamp (not shown).

After the alignment step, as shown in FIG. 17, the substrate 91 may be brought into close contact with the deposition masks 20 as the close contact step. The substrate 91 may be brought into close contact with the first mask face 20a of each deposition mask 20.

More specifically, initially, the deposition mask apparatus 10 is placed in the deposition apparatus 80 such that the first mask face 20a of each deposition mask 20 is oriented upward. The substrate 91 is held by a clamp. Subsequently, the substrate 91 is placed above the deposition masks 20 in a state of being held by the clamp. Then, the second substrate face 91b of the substrate 91 and the first mask face 20a of each deposition mask 20 are butted against each other.

After that, as shown in FIG. 17, the magnet 85 is set on the top face of the substrate 91, and the deposition masks 20 are attracted to the substrate 91 by the magnetic force of the magnet 85. As a result, the substrate 91 closely contacts with the first mask face 20a of each deposition mask 20. When the first electrodes 94 are anodes, the first electrodes 94 and hole injection layers and hole transport layers that are components of the energization layers 95 may be formed on the substrate 91 before the deposition masks 20 are brought into close contact with the substrate 91.

Figure 18:
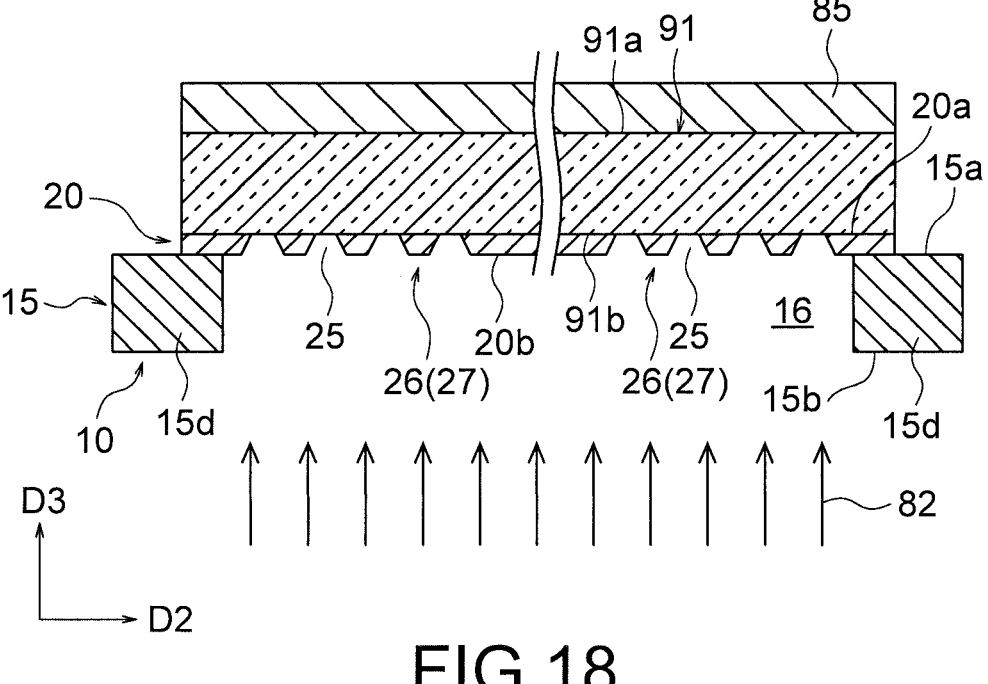
FIG. 18 is a view that shows a deposition step in the method of manufacturing the organic EL display device according to the embodiment of the present disclosure.

After the close contact step, as shown in FIG. 18, the light emitting layers 92 may be formed by depositing the deposition material 82 on the substrate 91 through the through-holes 25 of the deposition masks 20 as the deposition step. The light emitting layers 92 are formed on the hole transport layers of the corresponding energization layers 95. More specifically, the internal space of the deposition apparatus 80 is set to a vacuum atmosphere, and the deposition material 82 is evaporated to fly onto the substrate 91. The incoming deposition material 82 passes through the through-holes 25 of the deposition masks 20 and reaches and adheres to the hole transport layers of the desired energization layers 95. As a result, the light emitting layers 92 are formed on the substrate 91 in a pattern corresponding to the pattern of the through-holes 25.

As described above, in the present embodiment, the through-holes 25 are arranged in each effective area 27 in a predetermined pattern. When color display with a plurality of colors is intended to be performed, the deposition mask apparatus 10 including the deposition masks 20 and, respectively, corresponding to the colors are prepared, and the deposition material 82 of each color is deposited on the hole transport layers of the corresponding energization layers 95 with a corresponding one of the deposition mask apparatuses 10. With this configuration, for example, an organic luminescent material for red color, an organic luminescent material for green color, and an organic luminescent material for blue color can be deposited on one substrate 91.

After the light emitting layers 92 are formed, an electron transport layer and an electron injection layer that are components of the energization layer 95 are formed on each of the light emitting layers 92, and the energization layers 95 are obtained. After that, the second electrode 96 is formed on each of the energization layers 95.

In this way, the organic EL display device 90 in which the light emitting layers 92 of the respective colors are formed is obtained on the substrate 91.

After the organic EL display device 90 is manufactured, when another organic EL display device 90 is manufactured, the deposition mask apparatus 10 may be removed from the deposition apparatus 80. The removed deposition mask apparatus 10 may be attached to the deposition apparatus 80 again when a corresponding organic EL display device 90 is manufactured. In this case as well, misalignment of the second alignment mask holes 44 of the alignment mask 40 is suppressed.

More specifically, the first alignment weld 51 and the second alignment weld 52, respectively, are formed on both sides of each of the first alignment mask holes 43 in the second direction D2. With this configuration, a deflection of the first alignment overlap portion 41 in the third direction D3 is suppressed during handling of the deposition mask apparatus 10. Therefore, it is possible to suppress misalignment of the first alignment mask holes 43, so the alignment accuracy between the deposition mask apparatus 10 and the substrate 91 can be reproduced.

Similarly, the third alignment weld 53 and the fourth alignment weld 54, respectively, are formed on both sides of the second alignment mask holes 44 in the second direction D2. With this configuration, a deflection of the second alignment overlap portion 42 in the third direction D3 is suppressed during handling of the deposition mask apparatus 10. Therefore, it is possible to suppress misalignment of the second alignment mask holes 44, so the alignment accuracy between the deposition mask apparatus 10 and the substrate 91 can be reproduced.

In this way, according to the present embodiment, the first alignment weld 51 is located in the outer side of the alignment mask 40 in the second direction D2 with respect to a corresponding one of the first alignment mask holes 43. the second alignment weld 52 is located in the inner side of the alignment mask 40 in the second direction D2 with respect to a corresponding one of the first alignment mask holes 43. With this configuration, the alignment mask 40 can be fixed to the frame 15 on both sides of the first alignment mask hole 43 in the second direction D2, so it is possible to suppress a deflection of the alignment mask 40 in the third direction D3. Therefore, it is possible to suppress misalignment of the first alignment mask hole 43. As a result, it is possible to improve the alignment accuracy between the alignment mask 40 and the frame 15.

According to the present embodiment, the first alignment weld 51 includes the plurality of first weld split portions 51a arranged in the first direction D1, and the second alignment weld 52 includes the plurality of second weld split portions 52a arranged in the first direction D1. With this configuration, the alignment mask 40 can be further firmly fixed to the frame 15 on both sides of the first alignment mask hole 43 in the second direction D2, so it is possible to further suppress a deflection of the alignment mask 40 in the third direction D3. Therefore, it is possible to further suppress misalignment of the first alignment mask hole 43.

According to the present embodiment, the frame 15 has the first frame alignment hole 17 extending from the first frame face 15a toward the second frame face 15b. The first frame alignment hole 17 overlaps the first alignment mask holes 43 in plan view. With this configuration, it is possible to align the alignment mask 40 with the frame 15 by using the first alignment mask hole 43 and the first frame alignment hole 17.

According to the present embodiment, the first frame alignment hole 17 extend through from the first frame face 15a to the second frame face 15b. With this configuration, the first frame alignment hole 17 can be formed from the first frame face 15a by machining or can be formed from the second frame face 15b by machining. Therefore, it is possible to easily form the first frame alignment hole 17.

According to the present embodiment, the first frame alignment hole 17 extend in the third direction D3 orthogonal to the first direction D1 and the second direction D2. With this configuration, it is possible to visually recognize the first alignment mask hole 43 via the first frame alignment hole 17 in a direction from the second frame face 15b of the frame 15 toward the first frame face 15a.

According to the present embodiment, the first alignment mask holes 43, respectively, are located on both sides of the frame opening 16 in the second direction D2. With this configuration, the two first alignment mask holes 43 of the alignment mask 40 can be located away from each other in the second direction D2. Therefore, it is possible to improve the alignment accuracy between the alignment mask 40 and the frame 15.

According to the present embodiment, the alignment mask 40 has two second alignment mask holes 44 that are located at positions different from each other in the second direction D2 and that overlap the frame 15. The two second alignment mask holes 44 are located between one of the second alignment welds 52 and the other one of the second alignment welds 52 in the second direction D2. With this configuration, it is possible to align the deposition mask apparatus 10 with the substrate 91 by using the second alignment mask holes 44.

According to the present embodiment, the third alignment weld 53 is located in the outer side of the alignment mask 40 in the second direction D2 with respect to a corresponding one of the second alignment mask holes 44. The fourth alignment weld 54 is located in the inner side of the alignment mask 40 in the second direction D2 with respect to a corresponding one of the second alignment mask holes 44. With this configuration, the alignment mask 40 can be fixed to the frame 15 on both sides of each of the second alignment mask holes 44 in the second direction D2, so it is possible to suppress a deflection of the alignment mask 40 in the third direction D3. Therefore, it is possible to suppress misalignment of the second alignment mask holes 44. As a result, it is possible to improve the alignment accuracy between the alignment mask 40 and the frame 15.

According to the present embodiment, the third alignment weld 53 includes the plurality of third weld split portions 53a arranged in the first direction D1, and the fourth alignment weld 54 includes the plurality of fourth weld split portions 54a arranged in the first direction D1. With this configuration, the alignment mask 40 can be further firmly fixed to the frame 15 on both sides of the second alignment mask hole 44 in the second direction D2, so it is possible to further suppress a deflection of the alignment mask 40 in the third direction D3. Therefore, it is possible to further suppress misalignment of the second alignment mask hole 44.

According to the present embodiment, the frame 15 has the second frame alignment hole 18 extending from the first frame face 15a toward the second frame face 15b. The second frame alignment hole 18 have the alignment frame opening 18a located at the first frame face 15a. The alignment frame opening 18a may overlap a corresponding one of the second alignment mask holes 44 in plan view. With this configuration, it is possible to align the deposition mask apparatus 10 with the substrate 91 by using the second alignment mask hole 44 and the alignment frame opening 18a. When the second alignment mask hole 44 is viewed in a direction from the first alignment mask face 40a of the alignment mask 40 toward the second alignment mask face 40b, the alignment frame opening 18a can be visually recognized through the second alignment mask hole 44. In this case, it is possible to improve the visibility of the second alignment mask hole 44.

According to the present embodiment, the second frame alignment hole 18 extends through from the first frame face 15a to the second frame face 15b. With this configuration, the second frame alignment hole 18 can be formed from the first frame face 15a by machining or can be formed from the second frame face 15b by machining. Therefore, it is possible to easily form the second frame alignment hole 18.

According to the present embodiment, the second frame alignment hole 18 is inclined with respect to the first frame face 15a. With this configuration, even when the second frame alignment hole 18 extends through the frame 15, it is possible to reduce the arrival of the deposition material 82 at the alignment frame opening 18a in the deposition step. Therefore, it is possible to perform deposition multiple times with one deposition mask apparatus 10, and the deposition mask apparatus 10 can be repeatedly used. When the second frame alignment hole 18 is inclined with respect to the first frame face 15a, it is possible to increase the contrast between the second frame alignment hole 18 and the second alignment mask hole 44. Therefore, it is possible to improve the visibility of the second alignment mask hole 44.

According to the present embodiment, the second alignment mask hole 44 is located on one side of the frame opening 16 in the first direction D1. With this configuration, the first alignment mask hole 43 of the two alignment masks 40 can be located away from each other in the first direction D1. Therefore, it is possible to improve the alignment accuracy between the alignment masks 40 and the frame 15.

Various changes may be applied to the above-described embodiment. Hereinafter, modifications will be described with reference to the attached drawings as needed. In the following description and the drawings used in the following description, like reference signs to the reference signs used for corresponding portions in the above-described embodiment are used for portions that can be similarly configured to those of the above-described embodiment, and the description thereof will not be repeated. When the operation and advantageous effects obtained in the above-described embodiment are also apparently obtained in the modifications, the description thereof may be omitted.

In the above-described present embodiment, an example in which the second frame alignment hole 18 is inclined with respect to the first frame face 15a has been described. However, the configuration is not limited thereto. For example, the second frame alignment hole 18 does not need to be inclined with respect to the first frame face 15a as long as it is possible to reduce the arrival of the deposition material 82 at the alignment frame opening 18a in the deposition step.

In the above-described present embodiment, an example in which the deposition mask apparatus 10 and the substrate 91 are aligned with each other by using the second alignment mask hole 44 has been described. However, the configuration is not limited thereto. For example, it is possible to align the deposition mask apparatus 10 with the substrate 91 by using the first alignment mask hole 43. In this case, the alignment mask 40 does not need to have the second alignment mask hole 44, and the frame 15 does not need to have the second frame alignment hole 18. The alignment mask 40 does not need to include the third alignment weld 53 and do not need to include the fourth alignment weld 54.

In the above-described present embodiment, an example in which, in the second direction D2, the first alignment weld 51 is located on the outer side of a the first alignment mask holes 43 and the second alignment weld 52 is located on the inner side of the first alignment mask hole 43 has been described. However, the configuration is not limited thereto.

Figure 19:
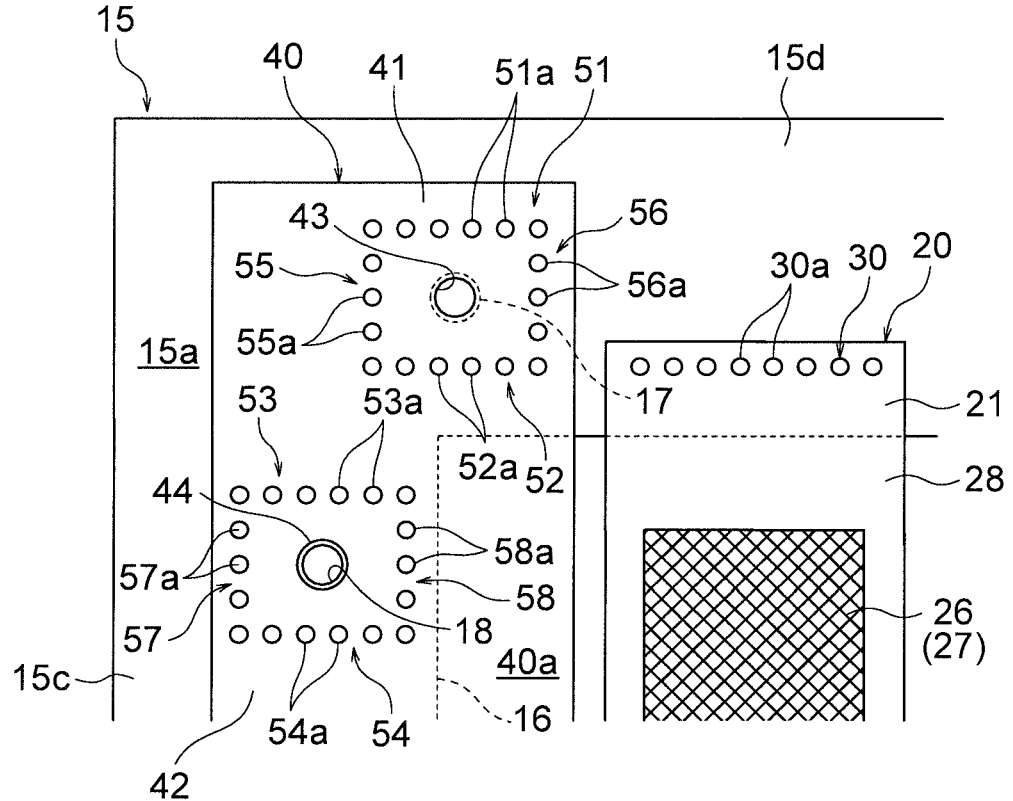
FIG. 19 is a partially enlarged plan view that shows a modification of the deposition mask apparatus shown in FIG. 7.

For example, as shown in FIG. 19, an alignment weld that joins the frame 15 with the alignment mask 40 may be located at least on one side of a corresponding one of the first alignment mask holes 43 in the first direction D1. More specifically, at least one of a fifth alignment weld 55 and a sixth alignment weld 56 shown in FIG. 19 may be formed in the alignment mask 40. The fifth alignment weld 55 and the sixth alignment weld 56 each are an example of a fifth weld. Any one of the fifth alignment weld 55 and the sixth alignment weld 56 may be formed in the alignment mask 40, and the other does not need to be formed in the alignment mask 40. As shown in FIG. 19, both the fifth alignment weld 55 and the sixth alignment weld 56 may be formed in the alignment mask 40. In this case, each of the first alignment mask holes 43 is surrounded by the alignment welds 51, 52, 55, 56.

As shown in FIG. 19, the fifth alignment weld 55 may be located in the outer side of the frame 15 in the first direction D1 with respect to the first alignment mask hole 43. In this case, the fifth alignment weld 55 is located at a position farther from the center of the alignment mask 40 in the first direction D1 than the first alignment mask hole 43. The fifth alignment weld 55 may include a plurality of fifth weld split portions 55a. The plurality of fifth weld split portions 55a may be arranged in the second direction D2. The fifth weld split portions 55a may be disposed on both sides of the first alignment mask hole 43 in the second direction D2. The fifth weld split portions 55a may be formed similarly to the first weld split portions 51a or the like.

The sixth alignment weld 56 may be located in the inner side of the frame 15 in the first direction D1 with respect to the first alignment mask hole 43. In this case, the sixth alignment weld 56 is located at a position closer to the center of the alignment mask 40 in the first direction D1 than the first alignment mask hole 43. The sixth alignment weld 56 may include a plurality of sixth weld split portions 56a. The plurality of sixth weld split portions 56a may be arranged in the second direction D2. The sixth weld split portions 56a may be disposed on both sides of the first alignment mask hole 43 in the second direction D2. The sixth weld split portions 56a may be formed similarly to the first weld split portions 51a or the like.

In this way, according to the modification shown in FIG. 19, the alignment mask 40 can be fixed to the frame 15 on both sides of each of the first alignment mask holes 43 in the second direction D2. The alignment mask 40 can be fixed to the frame 15 on both sides of each of the first alignment mask holes 43 in the first direction D1. With this configuration, it is possible to further suppress a deflection of the alignment mask 40 in the third direction D3, so it is possible to further suppress misalignment of the first alignment mask holes 43.

For example, as shown in FIG. 19, an alignment weld that joins the frame 15 with the alignment mask 40 may be located at least on one side of a corresponding one of the second alignment mask holes 44 in the first direction D1. At least one of a seventh alignment weld 57 and an eighth alignment weld 58 may be formed in the alignment mask 40. The seventh alignment weld 57 and the eighth alignment weld 58 each are an example of a sixth weld. Any one of the seventh alignment weld 57 and the eighth alignment weld 58 may be formed in the alignment mask 40, and the other does not need to be formed in the alignment mask 40. Both the seventh alignment weld 57 and the eighth alignment weld 58 may be formed in the alignment mask 40. In this case, each of the second alignment mask holes 44 is surrounded by the alignment welds 53, 54, 57, 58.

As shown in FIG. 19, the seventh alignment weld 57 may be located in the outer side of the frame 15 in the first direction D1 with respect to the second alignment mask hole 44. In this case, the seventh alignment weld 57 is located at a position farther from the center of the alignment mask 40 in the first direction D1 than the second alignment mask hole 44. The seventh alignment weld 57 may include a plurality of seventh weld split portions 57a. The plurality of seventh weld split portions 57a may be arranged in the second direction D2. The seventh weld split portions 57a may be disposed on both sides of the second alignment mask hole 44 in the second direction D2. The seventh weld split portions 57a may be formed similarly to the first weld split portions 51a or the like.

The eighth alignment weld 58 may be located in the inner side of the frame 15 in the first direction D1 with respect to the second alignment mask hole 44. In this case, the eighth alignment weld 58 is located at a position closer to the center of the alignment mask 40 in the first direction D1 than the second alignment mask hole 44. The eighth alignment weld 58 may include a plurality of eighth weld split portions 58*a*. The plurality of eighth weld split portions 58*a* may be arranged in the second direction D2. The eighth weld split portions 58*a* may be disposed on both sides of the second alignment mask hole 44 in the second direction D2. The eighth weld split portions 58*a* may be formed similarly to the first weld split portions 51*a* or the like.

In this way, according to the modification shown in FIG. 19, the alignment mask 40 can be fixed to the frame 15 on both sides of each of the second alignment mask holes 44 in the second direction D2. The alignment mask 40 can be fixed to the frame 15 on both sides of each of the second alignment mask holes 44 in the first direction D1. With this configuration, it is possible to further suppress a deflection of the alignment mask 40 in the third direction D3, so it is possible to further suppress misalignment of the second alignment mask holes 44.

Figure 20:
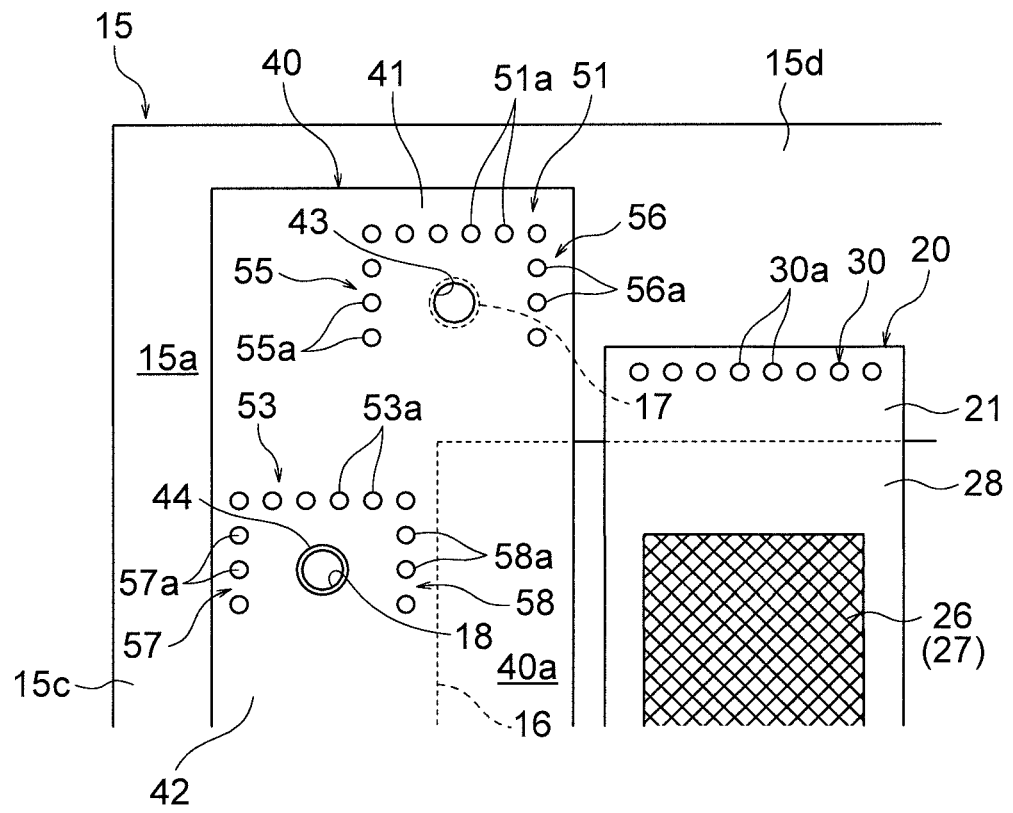
FIG. 20 is a partially enlarged plan view that shows a modification of the deposition mask apparatus shown in FIG. 19.

In the example shown in FIG. 19, an example in which the first alignment weld 51, the second alignment weld 52, the fifth alignment weld 55, and the sixth alignment weld 56 are formed for each of the first alignment mask holes 43 has been described. However, the configuration is not limited thereto. For example, as shown in FIG. 20, the second alignment weld 52 does not need to be formed. In this case, the first alignment weld 51, the fifth alignment weld 55, and the sixth alignment weld 56 are formed for each of the first alignment mask holes 43. According to the modification shown in FIG. 20, the alignment mask 40 can be fixed to the frame 15 on the outer side of each of the first alignment mask holes 43 in the second direction D2. The alignment mask 40 can be fixed to the frame 15 on both sides of each of the first alignment mask holes 43 in the first direction D1. With this configuration, it is possible to suppress a deflection of the alignment mask 40 in the third direction D3, so it is possible to suppress misalignment of the first alignment mask holes 43.

In the example shown in FIG. 19, an example in which the third alignment weld 53, the fourth alignment weld 54, the seventh alignment weld 57, and the eighth alignment weld 58 are formed for each of the second alignment mask holes 44 has been described. However, the configuration is not limited thereto. For example, as shown in FIG. 20, the fourth alignment weld 54 does not need to be formed. In this case, the third alignment weld 53, the seventh alignment weld 57, and the eighth alignment weld 58 are formed for each of the second alignment mask holes 44. According to the modification shown in FIG. 20, the alignment mask 40 can be fixed to the frame 15 on the outer side of each of the second alignment mask holes 44 in the second direction D2. The alignment mask 40 can be fixed to the frame 15 on both sides of each of the second alignment mask holes 44 in the first direction D1. With this configuration, it is possible to suppress a deflection of the alignment mask 40 in the third direction D3, so it is possible to suppress misalignment of the second alignment mask holes 44.

Some modifications to the above-described embodiment have been described; of course, a combination of some of the modifications is applicable as needed.

What is claimed is:

1. A deposition mask apparatus comprising:
   a frame having a first frame face, a second frame face located on an opposite side to the first frame face, and a frame opening extending through from the first frame face to the second frame face;

a deposition mask joined to the first frame face and having a plurality of through-holes overlapping the frame opening in plan view; and
   an alignment mask joined to the first frame face and arranged side by side with the deposition mask in a first direction, wherein
   the alignment mask has two first alignment mask holes located at positions different from each other in a second direction orthogonal to the first direction and overlapping the frame,
   a first weld joining the frame with the alignment mask is located in an outer side of the alignment mask in the second direction with respect to each of the first alignment mask holes,
   a second weld joining the frame with the alignment mask is located in an inner side of the alignment mask in the second direction with respect to each of the first alignment mask holes,
   wherein the alignment mask has two second alignment mask holes located at positions different from each other in the second direction and overlapping the frame,
   wherein the second alignment mask holes are located between one of the second welds and the other one of the second welds in the second direction,
   wherein a third weld joining the frame with the alignment mask is located in an outer side of the alignment mask in the second direction with respect to each of the second alignment mask holes, and
   wherein a fourth weld joining the frame with the alignment mask is located in an inner side of the alignment mask in the second direction with respect to each of the second alignment mask holes.

2. The deposition mask apparatus according to claim 1, wherein the first weld includes a plurality of first weld split portions arranged in the first direction, and
   the second weld includes a plurality of second weld split portions arranged in the first direction.

3. The deposition mask apparatus according to claim 1, wherein the frame has a first frame alignment hole extending from the first frame face toward the second frame face and overlapping any one of the first alignment mask holes in plan view.

4. The deposition mask apparatus according to claim 3, wherein the first frame alignment hole extends through from the first frame face to the second frame face.

5. The deposition mask apparatus according to claim 4, wherein the first frame alignment hole extends in a third direction orthogonal to the first direction and the second direction.

6. The deposition mask apparatus according to claim 1, wherein the first alignment mask holes, respectively, are located on both sides of the frame opening in the second direction.

7. The deposition mask apparatus according to claim 1, wherein a fifth weld joining the frame with the alignment mask is located on at least one side of the first alignment mask holes in the first direction.

8. The deposition mask apparatus according to claim 1, wherein the third weld includes a plurality of third weld split portions arranged in the first direction, and
   wherein the fourth weld includes a plurality of fourth weld split portions arranged in the first direction.

9. The deposition mask apparatus according to claim 1, wherein the frame has a second frame alignment hole extending from the first frame face toward the second frame face, and wherein the second frame alignment hole has an alignment frame opening located at the first frame face and overlapping any one of the second alignment mask holes in plan view.

10. The deposition mask apparatus according to claim 9, wherein the second frame alignment hole extends through from the first frame face to the second frame face.

11. The deposition mask apparatus according to claim 10, wherein the second frame alignment hole is inclined with respect to the first frame face.

12. The deposition mask apparatus according to claim 1, wherein the second alignment mask holes are located on one side of the frame opening in the first direction.

13. The deposition mask apparatus according to claim 1, wherein a sixth weld joining the frame with the alignment mask is located on at least one side in the first direction with respect to each of the second alignment mask holes.

14. A method of manufacturing an organic device, the method comprising:

an apparatus preparation step of preparing the deposition mask apparatus according to claim 1;

an alignment step of aligning the deposition mask apparatus with a substrate;

a close contact step of bringing the deposition mask of the deposition mask apparatus into close contact with the substrate; and a deposition step of forming deposition layers by depositing a deposition material on the substrate through the through-holes of the deposition mask.

15. A deposition mask apparatus comprising:

a frame having a first frame face, a second frame face located on an opposite side to the first frame face, and a frame opening extending through from the first frame face to the second frame face;

a deposition mask joined to the first frame face and having a plurality of through-holes overlapping the frame opening in plan view; and an alignment mask joined to the first frame face and arranged side by side with the deposition mask in a first direction, wherein the alignment mask has two first alignment mask holes, each having a location in the first direction that overlaps a location of the frame opening in the first direction, and located at positions different from each other in a second direction orthogonal to the first direction and overlapping the frame, wherein a first weld joining the frame with the alignment mask is located in an outer side of the alignment mask in the second direction with respect to each of the first alignment mask holes, wherein a second weld joining the frame with the alignment mask is located in an inner side of the alignment mask in the second direction with respect to each of the first alignment mask holes, wherein the alignment mask has two second alignment mask holes located at positions different from each other in the second direction and overlapping the frame, wherein the second alignment mask holes are located between one of the second welds and the other one of the second welds in the second direction, and wherein a sixth weld joining the frame with the alignment mask is located on at least one side in the first direction with respect to each of the second alignment mask holes.

\* \* \* \* \*